United States Patent
Bergendahl et al.

(10) Patent No.: US 10,361,079 B2
(45) Date of Patent: Jul. 23, 2019

(54) MULTI-ANGLED DEPOSITION AND MASKING FOR CUSTOM SPACER TRIM AND SELECTED SPACER REMOVAL

(71) Applicant: International Business Machines Corporation, Armonk, NY (US)

(72) Inventors: Marc A. Bergendahl, Troy, NY (US); Sean D. Burns, Hopewell Junction, NY (US); Lawrence A. Clevenger, LaGrangeville, NY (US); Christopher J. Penny, Saratoga Springs, NY (US); Michael Rizzolo, Albany, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 15/810,463

(22) Filed: Nov. 13, 2017

(65) Prior Publication Data
US 2018/0076035 A1    Mar. 15, 2018

Related U.S. Application Data

(62) Division of application No. 15/261,291, filed on Sep. 9, 2016, now Pat. No. 10,002,762.

(51) Int. Cl.
| | | |
|---|---|---|
| *H01L 21/033* | (2006.01) | |
| *H01L 21/311* | (2006.01) | |
| *H01L 21/3115* | (2006.01) | |

(52) U.S. Cl.
CPC ...... *H01L 21/0337* (2013.01); *H01L 21/0338* (2013.01); *H01L 21/31116* (2013.01); *H01L 21/31144* (2013.01); *H01L 21/31155* (2013.01)

(58) Field of Classification Search
CPC . H01L 21/3086; H01L 21/311; H01L 21/845; H01L 27/1211; H01L 29/66795;
(Continued)

(56) References Cited

U.S. PATENT DOCUMENTS

| 6,794,256 B1 | 9/2004 | Fuselier et al. |
| 7,354,839 B2 * | 4/2008 | Wei .................. H01L 21/26586 |
| | | 257/E21.345 |

(Continued)

OTHER PUBLICATIONS

List of IBM Patents or Patent Applications Treated as Related.

*Primary Examiner* — Edward Chin
(74) *Attorney, Agent, or Firm* — Vazken Alexanian; Ryan, Mason & Lewis, LLP

(57) ABSTRACT

Multi-angled deposition and masking techniques are provided to enable custom trimming and selective removal of spacers that are used for patterning features at sub-lithographic dimensions. For example, a method includes forming a sacrificial mandrel on a substrate, and forming first and second spacers on opposing sidewalls of the sacrificial mandrel. The first and second spacers are formed with an initial thickness $T_S$. A first angle deposition process is performed to deposit a material (e.g., insulating material or metallic material) at a first deposition angle A1 to form a first trim mask layer on an upper portion of the first spacer and the sacrificial mandrel while preventing the material from being deposited on the second spacer. A spacer etch process is performed to trim the first spacer to a first thickness T1, which is less than $T_S$, using the first trim mask layer as an etch mask.

18 Claims, 18 Drawing Sheets

(58) Field of Classification Search
CPC ........... H01L 21/0337; H01L 21/31144; H01L 21/31116; H01L 21/31155; H01L 21/0338
See application file for complete search history.

(56) References Cited

U.S. PATENT DOCUMENTS

| | | | |
|---|---|---|---|
| 7,476,578 B1 | 1/2009 | Cheng et al. | |
| 8,048,788 B2 | 11/2011 | Hautala et al. | |
| 8,518,723 B2* | 8/2013 | Chang | H01L 21/0337 438/17 |
| 8,614,545 B2* | 12/2013 | Miyashita | H01L 27/3211 313/504 |
| 8,617,920 B2* | 12/2013 | Yamazaki | H01L 21/02554 257/43 |
| 8,716,797 B2 | 5/2014 | Basker et al. | |
| 8,822,320 B2 | 9/2014 | Cheng et al. | |
| 8,852,851 B2* | 10/2014 | Zhou | H01L 21/0337 430/311 |
| 8,906,807 B2* | 12/2014 | Bergendahl | H01L 21/3086 438/197 |
| 9,080,239 B2 | 7/2015 | Yang et al. | |
| 9,111,962 B1 | 8/2015 | Alptekin et al. | |
| 9,269,628 B1* | 2/2016 | Jacob | H01L 21/82343 |
| 9,287,135 B1 | 3/2016 | Doris et al. | |
| 9,818,611 B2* | 11/2017 | deVilliers | H01L 21/0337 |
| 9,947,804 B1* | 4/2018 | Frougier | H01L 29/78696 |
| 2007/0077743 A1* | 4/2007 | Rao | H01L 21/3086 438/595 |
| 2011/0175165 A1* | 7/2011 | Yu | H01L 29/66803 257/347 |
| 2014/0184991 A1* | 7/2014 | Lan | G02F 1/134309 349/96 |
| 2014/0217373 A1* | 8/2014 | Youn | H01L 23/4985 257/40 |
| 2014/0232956 A1* | 8/2014 | Kwon | G02F 1/133305 349/12 |
| 2014/0315380 A1* | 10/2014 | Kanakasabapathy | H01L 21/76802 438/618 |
| 2015/0234431 A1* | 8/2015 | Jung | G06F 1/1652 349/12 |
| 2016/0111485 A1* | 4/2016 | Chida | H01L 27/322 257/40 |

* cited by examiner

MULTI-ANGLED DEPOSITION AND MASKING FOR CUSTOM SPACER TRIM AND SELECTED SPACER REMOVAL

TECHNICAL FIELD

This disclosure generally relates to semiconductor fabrication techniques and, in particular, multi-patterning photolithographic methods for fabricating semiconductor integrated circuits.

BACKGROUND

Various types of multi-patterning photolithography techniques can be utilized to manufacture semiconductor integrated circuits. Such multi-patterning techniques include sidewall image transfer (SIT), self-aligned doubled patterning (SADP), and self-aligned quadruple patterning (SAQP) techniques, for example. These multi-patterning methods are utilized to enhance feature density, and are expected to be particularly useful and necessary for the next generation technology nodes, e.g., 10 nm and beyond. The current SIT, SADP and SAQP methods utilize deposition and etch back processes to create uniform memorization and transfer elements. In particular, these techniques involve spacer patterning steps in which spacers are formed on the sidewalls of sacrificial features (e.g., sacrificial mandrels), and the sacrificial features are removed, leaving a pattern of spacers which is utilized to etch features into an underlying layer at sub-lithographic dimensions. As is known in the art, the term "critical dimension" (CD) refers to the dimensions of the smallest geometrical features (width of interconnect line, contacts, trenches, etc.) which can be formed during semiconductor device fabrication using a given semiconductor technology. The CD is primarily determined by material thicknesses and etch rates. While wet and dry isotropic etch methods can be used to further reduce features below the CD of the features, these isotropic etch techniques are limited by the etch selectivity of the surrounding semiconductor materials.

SUMMARY

Embodiments of the invention include multi-angled deposition and masking techniques that enable custom trimming and selective removal of spacers that are used for patterning features at sub-lithographic dimensions.

One embodiment includes a method to form a pattern of spacers which are used for patterning features of a semiconductor device as follows. A sacrificial mandrel is formed on a substrate, wherein the sacrificial mandrel comprises opposing first and second sidewalls. A first spacer is formed on the first sidewall of the sacrificial mandrel and a second spacer is formed on the second sidewall of the sacrificial mandrel. The first and second spacers are formed to have an initial spacer thickness $T_S$. A first angle deposition process is performed to deposit a material at a first deposition angle A1 to form a first trim mask layer on an upper portion of the first spacer and the sacrificial mandrel while preventing the material from being deposited on the second spacer. A spacer etch process is performed to trim the first spacer to a first thickness T1, which is less than $T_S$, using the first trim mask layer as an etch mask. The trimmed first spacer is utilized to pattern an underlying layer of the substrate. The material that is angle deposited to form the first trim mask layer comprises an insulating material or a metallic material.

In another embodiment, the method further comprises performing a second angle deposition process to deposit a material (e.g., insulating material or metallic material) at a second deposition angle A2 to form a second trim mask layer on an upper portion of the second spacer and the sacrificial mandrel while preventing additional material from being deposited on the first spacer. The spacer etch process is further performed to trim the second spacer to a second thickness T2, which is less than $T_S$, using the second trim mask layer as an etch mask. In one embodiment, the first and second deposition angles A1 and A2 are selected to form the first and second trim mask layers so that the trimmed thicknesses T1 and T2 of the first and second spacers are substantially the same. In another embodiment, the first and second deposition angles A1 and A2 are selected to form the first and second trim mask layers so that the trimmed thicknesses T1 and T2 of the first and second spacers are different.

Another embodiment includes a method to form a pattern of spacers which are used for patterning feature of a semiconductor device as follows. A plurality of sacrificial mandrels are formed on a substrate, which comprise at least a first sacrificial mandrel and a second sacrificial mandrel, wherein each sacrificial mandrel comprises opposing first and second sidewalls. A first spacer is formed on the first sidewall of each sacrificial mandrel and a second spacer is formed on the second sidewall of each sacrificial mandrel. The first and second spacers are formed to have an initial spacer thickness $T_S$. A first angle deposition process is performed to deposit material (e.g., insulating material or metallic material) at a first deposition angle A1 to form a first trim mask layer on an upper portion of each of the first spacers and on the upper surfaces of the sacrificial mandrels while preventing the material from being deposited on the second spacers. A first planarized insulating layer is formed over the substrate to cover the first and second spacers and the sacrificial mandrels. A first etch mask is formed on the planarized insulating layer, wherein the first etch mask comprises an opening having a lateral width W1 which is greater than the thickness $T_S$ of the first and second spacers. The opening along a direction of the lateral width W1 overlaps an entire thickness $T_S$ of a length portion of the second spacer disposed on the second sidewall of first sacrificial mandrel and at least one of (i) a portion of the first trim mask layer covering the upper surface of the first sacrificial mandrel and the first spacer disposed on the first sidewall of the first sacrificial mandrel and (ii) a portion of the planarized insulating layer disposed adjacent to the second spacer. An etch process is performed to remove a portion of planarized insulating layer exposed through the opening of the first etch mask, and to remove a portion of the second spacer exposed through the opening of the first etch mask.

Other embodiments will be described in the following detailed description of embodiments, which is to be read in conjunction with the accompanying figures.

BRIEF DESCRIPTION OF THE DRAWINGS

FIGS. 1 through 9B schematically illustrate a global spacer trimming process according to an embodiment of the invention, wherein:

FIG. 1 is a cross-sectional schematic view of a semiconductor device at an intermediate stage of fabrication which comprises a substrate, and a first insulating layer, a hard mask layer, and a second insulating layer sequentially formed on the substrate;

FIG. 2 is cross-sectional schematic side view of the semiconductor structure of FIG. 1 after forming an etch mask which is used to pattern the underlying second insulating layer;

FIG. 4 is a cross-sectional schematic side view of the semiconductor structure of FIG. 3A after depositing a conformal layer of insulating material to conformally cover the surfaces of the sacrificial mandrel features with spacer material;

FIG. 7 schematically illustrates an angle deposition process that is performed on the semiconductor structure of FIG. 6A for angle depositing a layer of material to form spacer trim masks on the spacers that are disposed on second sidewalls, opposite the first sidewalls, of the sacrificial mandrel features;

FIG. 8 is a schematic cross-sectional side view of the semiconductor structure of FIG. 7 showing an etch process that is performed to differentially trim the exposed sidewall surfaces of the spacers on opposing sidewalls of the sacrificial mandrel features to have different thicknesses; and FIGS. 9A and 9B schematically illustrate the semiconductor structure of FIG. 8 after removing the spacer trim masks from the spacers.

FIGS. 10 through 19B schematically illustrate a method for selectively removing and/or trimming one or more spacers according to an embodiment of the invention, wherein:

FIG. 10 schematically illustrates an example of an angle deposition process that is performed on the semiconductor structure of FIG. 5A for angle depositing a layer of material at a deposition angle A4 to form spacer trim masks on the spacers that are disposed on first sidewalls of the sacrificial mandrel features;

FIG. 12 is a schematic cross-sectional side view of the semiconductor structure of FIG. 11A after etching exposed portions of the first planarized insulating layer and a target spacer through an opening of the first etch mask;

FIG. 13 is a schematic cross-sectional side view of the semiconductor structure of FIG. 12 after removing remaining portions of the first etch mask and the first planarized insulating layer;

FIG. 15 schematically illustrates an angle deposition process that is performed on the semiconductor structure of FIGS. 14A and 14B for angle depositing a layer of material to form spacer trim masks on the spacers that are disposed on the second sidewalls, opposite the first sidewalls, of the sacrificial mandrel features;

FIG. 18 is a schematic cross-sectional side view of the semiconductor structure of FIG. 17A after removing remaining portions of the second etch mask and the second planarized insulating layer; and FIGS. 19A and 19B schematically illustrate the semiconductor structure of FIG. 18 after removing the spacer trim masks from the spacers disposed on the second sidewalls of the sacrificial mandrel features.

FIGS. 20 through 23 schematically illustrate a method for utilizing the pattern of spacers shown in FIGS. 19A and 19B to pattern an underlying layer of a substrate, wherein:

FIG. 20 is a schematic cross-sectional side view of the semiconductor structure of FIG. 19A after etching away the sacrificial mandrel features selective to the spacers;

FIG. 21 is a schematic cross-sectional side view of the semiconductor structure of FIG. 20 after etching the underlying hard mask layer using the pattern of spacers as an etch mask to form a hard mask pattern;

FIG. 22 is a schematic cross-sectional side view of the semiconductor structure of FIG. 21 after selectively removing the spacers from the upper surface of the hard mask pattern; and FIG. 23 is a schematic cross-sectional side view of the semiconductor structure of FIG. 22 after etching the underlying insulating layer using the hard mask pattern.

DETAILED DESCRIPTION

Figure 1:
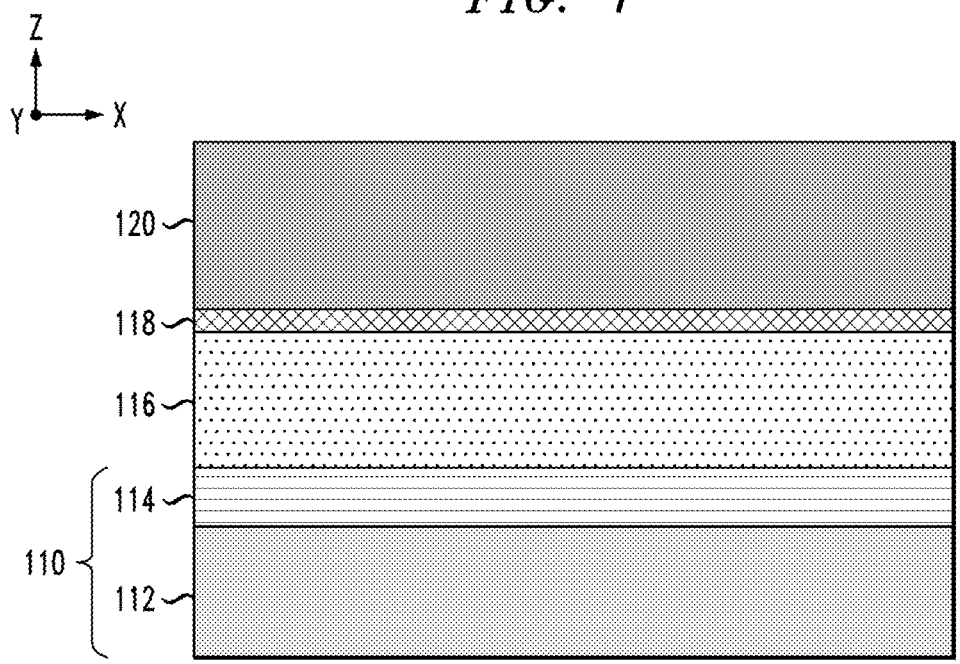

Embodiments of the invention will now be described in further detail with regard to multi-angled deposition and masking techniques that enable custom trimming and selective removal of spacer features that are for patterning other features at sub-lithographic dimensions. As explained in further detail below, multi-angled deposition and masking techniques according to embodiments of the invention are implemented by angle-depositing a layer of material (e.g., insulating material or metallic material) over portions of the spacers, which provide trim masks that are used for etching away exposed portions of the spacers (i.e., trimming the spacers) to adjust the thickness of the spacers, as desired, to sub-lithographic dimensions. The custom spacer thicknesses are achieved by modulating the angle of deposition of the material to cover more or less of the spacers, as desired, so that the spacers can be custom trimmed with high precision based on the angle of deposition. For example, with the exemplary spacer trimming methods described herein, the spacers on opposite sides of a given sacrificial feature (e.g., sacrificial mandrel) can be differentially trimmed to have different thicknesses by using different deposition angles to form different size trim masks on the spacers on opposite sides of the sacrificial feature.

It is to be understood that the various layers, structures, and regions shown in the accompanying drawings are schematic illustrations that are not drawn to scale. In addition, for ease of explanation, one or more layers, structures, and regions of a type commonly used to form semiconductor devices or structures may not be explicitly shown in a given drawing. This does not imply that any layers, structures, and regions not explicitly shown are omitted from the actual semiconductor structures.

Furthermore, it is to be understood that the embodiments discussed herein are not limited to the particular materials, features, and processing steps shown and described herein. In particular, with respect to semiconductor processing steps, it is to be emphasized that the descriptions provided herein are not intended to encompass all of the processing steps that may be required to form a functional semiconductor integrated circuit device. Rather, certain processing steps that are commonly used in forming semiconductor devices, such as, for example, wet cleaning and annealing steps, are purposefully not described herein for economy of description.

Moreover, the same or similar reference numbers are used throughout the drawings to denote the same or similar features, elements, or structures, and thus, a detailed explanation of the same or similar features, elements, or structures will not be repeated for each of the drawings. It is to be understood that the terms "about" or "substantially" as used herein with regard to thicknesses, widths, percentages, ranges, etc., are meant to denote being close or approximate to, but not exactly. For example, the term "about" or "substantially" as used herein implies that a small margin of error is present, such as 1% or less than the stated amount.

To provide spatial context to the different structural orientations of the semiconductor structures shown throughout the drawings, XYZ Cartesian coordinates are shown in each of the drawings. It is to be understood that the terms "vertical" or "vertical direction" as used herein denotes a Z-direction of the Cartesian coordinates shown in the drawings, and that the terms "horizontal" or "horizontal direction" as used herein denotes an X-direction and/or Y-direction of the Cartesian coordinates shown in the drawings, which is perpendicular to the Z-direction.

Methods for fabricating semiconductor devices using multi-angled deposition and masking techniques, which enable custom trimming and selective removal of patterning spacers that are used for patterning features at sub-lithographic dimensions, will now be discussed in further details with initial reference to FIG. 1. In particular, FIG. 1 is a cross-sectional schematic view of a semiconductor device 100 at an intermediate stage of fabrication which comprises a substrate 110, and a stack of layers formed on top of the substrate 110, including a first insulating layer 116, a hard mask layer 118, and a second insulating layer 120. The substrate 110 is generically depicted in FIG. 1 as comprising an underlying base semiconductor substrate 112 (e.g., semiconductor wafer) and a device/layer stack 114 comprising integrated circuitry and interconnect layers/structures that are formed on the base semiconductor substrate 112 prior to formation of the first insulating layer 116.

In one embodiment, the base semiconductor substrate 112 may be a bulk semiconductor substrate formed of, e.g., silicon, or other types of semiconductor substrate materials that are commonly used in bulk semiconductor fabrication processes such as germanium, silicon-germanium alloy, silicon carbide, silicon-germanium carbide alloy, or compound semiconductor materials (e.g. III-V and II-VI). Non-limiting examples of compound semiconductor materials include gallium arsenide, indium arsenide, and indium phosphide. In another embodiment, the base semiconductor substrate 112 may be a SOI (silicon on insulator) substrate, which comprises an insulating layer (e.g., oxide layer) disposed between a base substrate layer (e.g., silicon substrate) and an active semiconductor layer (e.g., active silicon layer) in which active circuit components (e.g., field effect transistors) are formed as part of a FEOL (front-end-of-line) layer.

The device/layer stack 114 comprises a FEOL layer, a MOL layer (or at least a portion of the MOL layer), and/or a BEOL layer (or at least a portion of the BEOL layer). As is known in the art, a FEOL layer comprises various semiconductor devices and components that are formed in or on the active surface of the semiconductor substrate 112 to provide integrated circuitry for a target application. For example, the FEOL layer comprises FET devices (such as FinFET devices, planar MOSFET device, etc.), bipolar transistors, diodes, capacitors, inductors, resistors, isolation devices, etc., which are formed in or on the active surface of the semiconductor substrate 112. In general, FEOL processes typically include preparing the semiconductor substrate 112 (or wafer), forming isolation structures (e.g., shallow trench isolation), forming device wells, patterning gate structures, forming spacers, forming source/drain regions (e.g., via implantation), forming silicide contacts on the source/drain regions, forming stress liners, etc.

Furthermore, a MOL layer is formed on the FEOL layer. In general, the MOL layer comprises one or more PMD (pre-metal dielectric) layers and conductive contacts (e.g., via contacts) that are formed in the PMD layer. The PMD layer is formed over the components and devices of the FEOL layer. A pattern of openings is formed in the PMD layer, and the openings are filled with a conductive material, such as tungsten, to form conductive via contacts that are in electrical contact with device terminals (e.g., source/drain regions, gate contacts, etc.) of the integrated circuitry of the FEOL layer. The conductive via contacts of the MOL layer provide electrical connections between the integrated circuitry of the FEOL layer and a first level of metallization of a BEOL structure.

A BEOL structure is formed on the FEOL/MOL structure to connect the various integrated circuit components of the FEOL layer. As is known in the art, a BEOL structure comprises multiple levels of dielectric material and levels of metallization embedded in the dielectric material. The BEOL metallization comprises horizontal wiring, interconnects, pads, etc., as well as vertical wiring in the form of conductive vias that form connections between different interconnect levels of the BEOL structure. A BEOL fabrication process involves successive depositing and patterning of multiple layers of dielectric and metallic material to form a network of electrical connections between the FEOL devices and to provide I/O connections to external components.

In the exemplary embodiment of FIG. 1, the first insulating layer 116 generically represents an insulating layer (e.g., PMD (pre-metal deposition) layer) of a MOL layer or an interlevel dielectric layer (ILD layer) that forms a given interconnect level of a BEOL layer. In this regard, the first insulating layer 116 is part of a MOL or BEOL layer which is to be patterned using multi-patterning photolithographic methods according to embodiments of the invention as discussed below. For example, for a BEOL layer, the first insulating layer can be etched using method discussed hereon to form a pattern of openings (e.g., trenches or vias) in the first insulating layer 116, which are to be filled with metallic materials such as copper to form wiring and vertical via structures, etc. The first insulating layer 116 can be formed using any suitable dielectric material including, but not limited to, silicon oxide (e.g. SiO2), SiN (e.g., (Si3N4), hydrogenated silicon carbon oxide (SiCOH), silicon based low-k dielectrics, porous dielectrics, or other known ULK (ultra-low-k) dielectric materials. The first insulating layer 116 can be deposited using known deposition techniques, such as, for example, ALD (atomic layer deposition), CVD (chemical vapor deposition) PECVD (plasma-enhanced CVD), or PVD (physical vapor deposition). The thickness of the first insulating layer 116 will vary depending on the application, and may have a thickness in a range of about 30 nm to about 200 nm, for example.

The hard mask layer 118 is formed on the first insulating layer 118 using known deposition techniques. The hard mask layer 118 is formed of a material that has etch selectivity with respect to the insulating materials of the first insulating layer 116 and the second insulating layer 120. For example, the hard mask layer 118 can be formed of a nitride material such as TiN or SiN, etc.

The second insulating layer 120 is formed of an insulating/dielectric material which has etch selectivity with respect to the material of the hard mask layer 118. For example, the second insulating layer 120 can be formed of an oxide material when the hard mask layer 118 is formed of a nitride material. The second insulating layer 120 is patterned to form a pattern of sacrificial features (e.g., sacrificial mandrels) on which spacers are subsequently formed to facilitate spacer patterning in subsequent processing steps as discussed below. The second insulating layer 120 is patterned using a process flow as schematically illustrated in FIGS. 2, 3A, and 3B.

Figure 2:
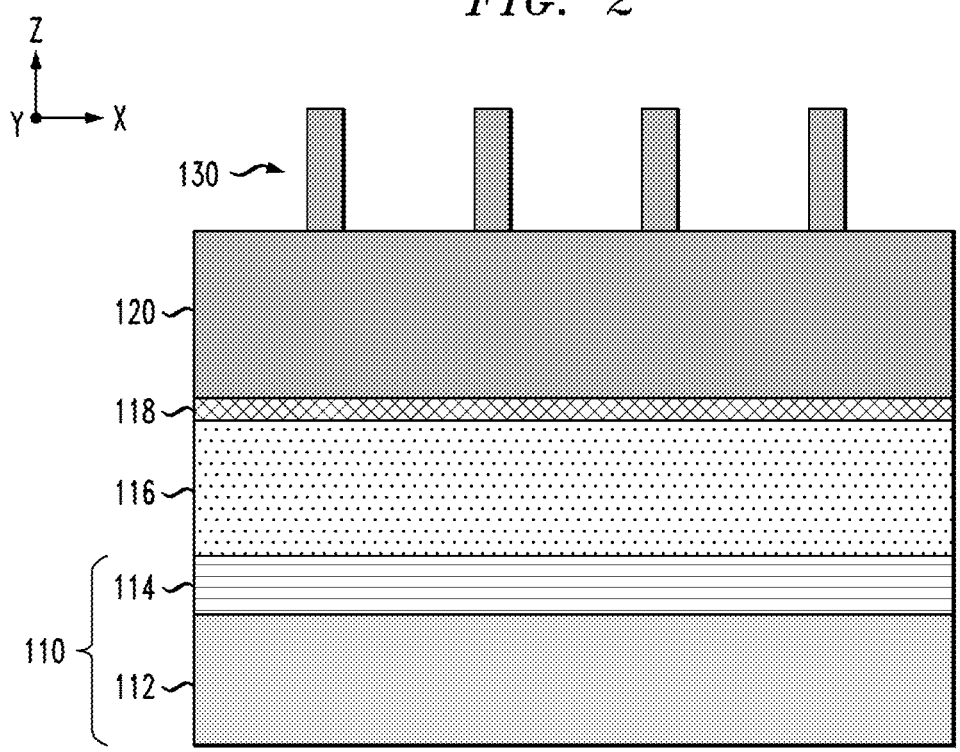

In particular, FIG. 2 is cross-sectional schematic side view of the semiconductor structure of FIG. 1 after forming an etch mask 130 on the second insulating layer 120, which is used to pattern the underlying second insulating layer 120. In one embodiment, the etch mask 130 comprises a photoresist mask that is formed by depositing a layer of photoresist material and patterning (exposing and developing) the layer of photoresist material to form the etch mask 130 shown in FIG. 2. In another embodiment, the etch mask 130 can be formed using other materials and techniques.

Figure 3A:
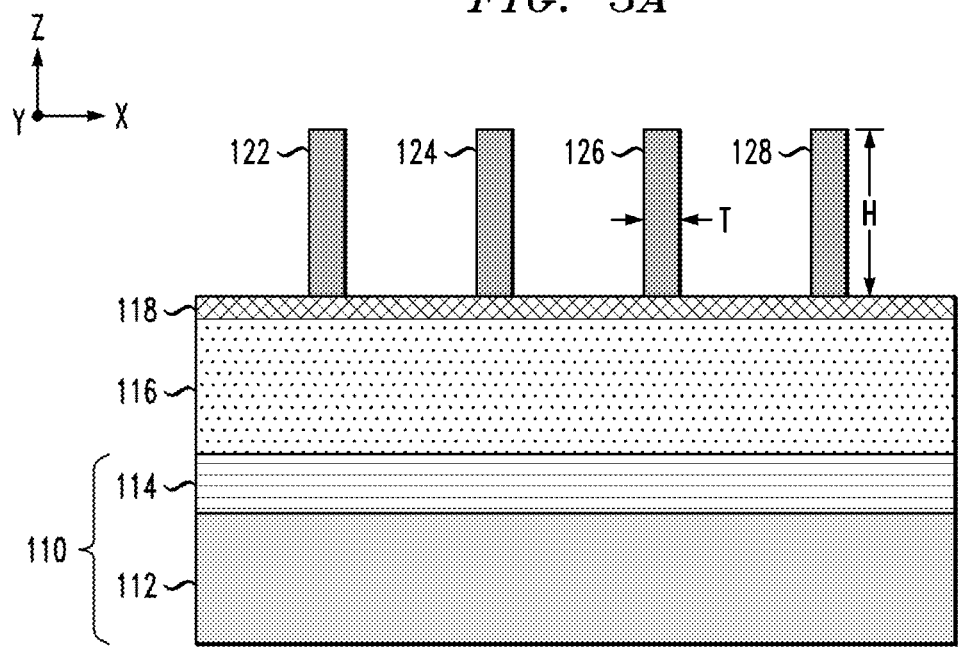
FIGS. 3A and 3B schematically illustrate the semiconductor structure of FIG. 2 after etching the second insulating layer to form a pattern of sacrificial mandrel features.

Next, FIG. 3A is cross-sectional schematic side view of the semiconductor structure of FIG. 2 after etching the second insulating layer 120 to form a pattern of sacrificial mandrel features 122, 124 126, 128. The pattern of sacrificial mandrel features 122, 124, 126, 128 is formed by transferring the image of the etch mask 130 into the second insulating layer 120. The second insulating layer 120 can be etched using a dry plasma etch process (e.g., RIE (reactive ion etch)) using an etch chemistry that is suitable to etch the material of the second insulating layer 120 selective to the underlying hard mask layer 118. In this regard, the hard mask layer 118 serves as an etch stop for the etch process.

Figure 3B:
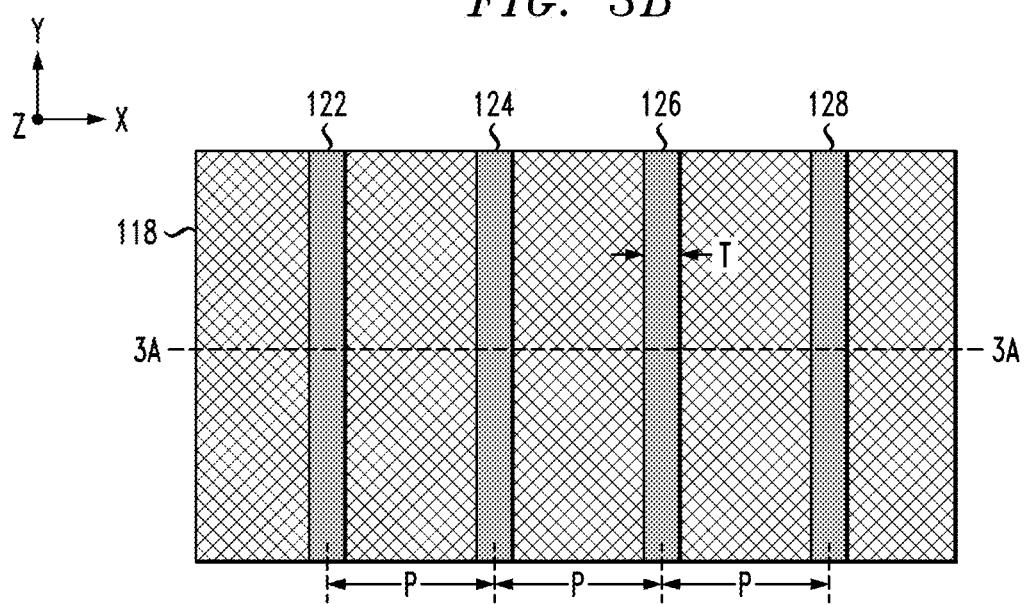

FIG. 3B is a schematic top plan view of the semiconductor structure shown in FIG. 3A, wherein FIG. 3A is a cross-sectional view of the semiconductor structure taken along line 3A-3A shown in FIG. 3B. As collectively shown in FIGS. 3A and 3B, the sacrificial mandrel features 122, 124, 126, and 128 comprise elongated features which are spaced apart by pitch P and which have a thickness T. In one embodiment, the pitch P is about 60 nm or less, and the thickness T is in a range of about 10 nm to about 15 nm. Furthermore, the sacrificial mandrel features 122, 124, 126, and 128 have a height H which is in a range of about 20 nm to about 50 nm.

Figure 4:
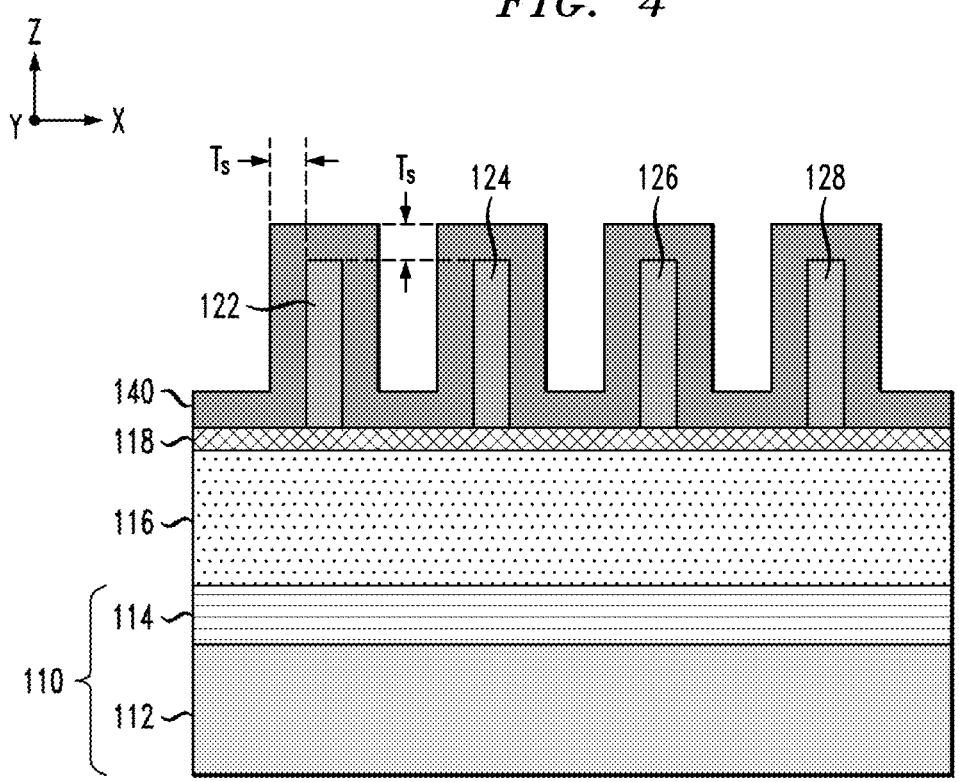
Figure 5A:
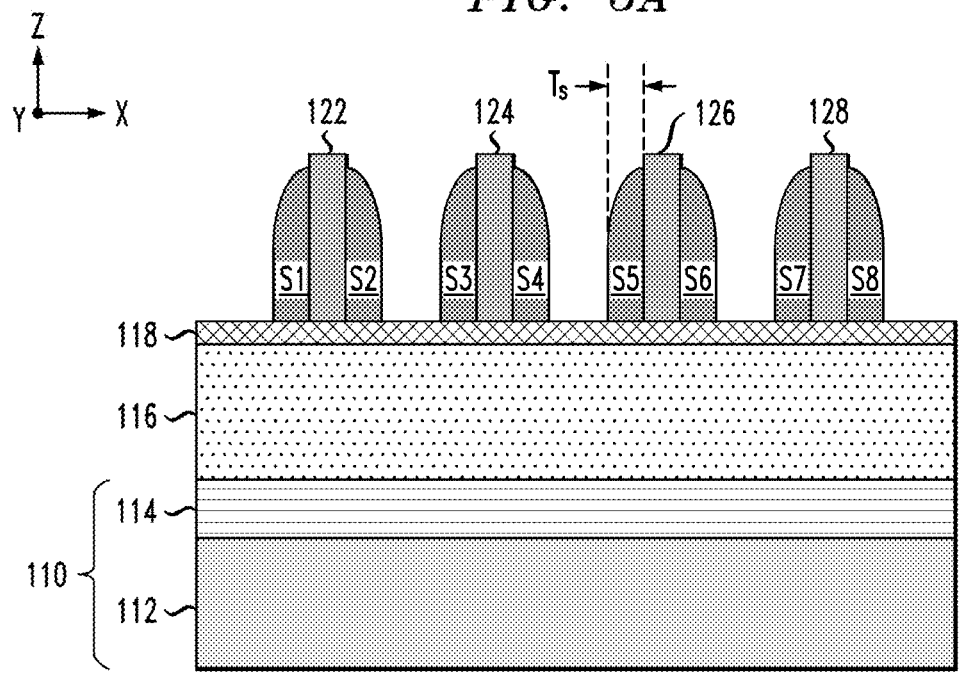
FIGS. 5A and 5B schematically illustrate the semiconductor structure of FIG. 4 after etching the conformal layer of insulating material to form a plurality of spacers on sidewalls of the sacrificial mandrel features.
Figure 5B:
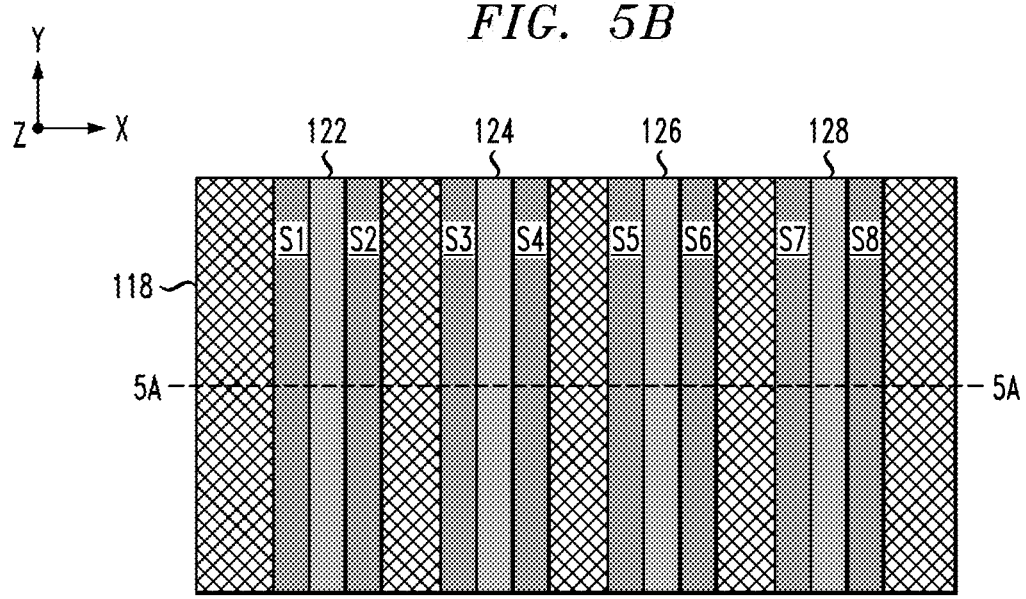

A next phase of the fabrication process comprises forming spacers on the sidewalls of the sacrificial mandrel features 122, 124, 126, and 128 using a process flow as schematically illustrated in FIGS. 4, 5A and 5B. For example, FIG. 4 is a cross-sectional schematic side view of the semiconductor structure of FIG. 3A after depositing a conformal layer of insulating material 140 to conformally cover the surfaces of the sacrificial mandrel features 122, 124, 126, and 128 with spacer material. In one embodiment of the invention, the layer of insulating material 140 is formed of a dielectric/insulating which has etch selectivity with respect to the material of the sacrificial mandrel features 122, 124, 126, and 128. For example, if the sacrificial mandrel features 122, 124, 126, and 128 are formed of an oxide material (e.g., silicon oxide), the conformal layer of insulating material 140 is formed of a nitride material (e.g., silicon nitride), and vice versa. In one example embodiment of the invention, the conformal layer of insulating material 140 is formed with a thickness $T_S$ in a range of about 10 nm to about 15 nm on the vertical and horizontal surface of the semiconductor structures.

FIGS. 5A and 5B schematically illustrate a next step in the process flow which comprises etching the conformal layer of insulating material 140 to form a plurality of spacers S1, S2, S3, S4, S5, S6, S7 and S8. FIG. 5B is a top plan view of the semiconductor structure shown in FIG. 5A, and FIG. 5A is a cross sectional view of the semiconductor structure taken along line 5A-5A in FIG. 5B. In particular, FIG. 5A is a cross-sectional schematic side view of the semiconductor structure of FIG. 4 after etching back and pulling down the conformal layer of insulating material 140 to etch away portions of the layer of insulating material 140 from the horizontal surfaces of the semiconductor structure, and to recess the insulating material on the upper vertical sidewalls of the sacrificial mandrel features 122, 124, 126, and 128. The etch process results in the formation of pairs of spacers S1/S2, S3/S4, S5/S6, and S7/S8 on opposing first and second sidewalls of the respective sacrificial mandrel features 122, 124, 126, and 128, wherein each spacer S1, S2, S3, S4, S5, S6, S7 and S8 has a thickness of about $T_S$.

In one embodiment of the invention, the etch back/pulldown etch process performed using a directional dry etch process (anisotropic), such as RIE, having an etch chemistry which is suitable to etch the material of the spacers S1, S2, S3, S4, S5, S6, S7 and S8 selective to the material of the sacrificial mandrel features 122, 124, 126, and 128. During the directional etch process, there is minimal or no etching of the underlying hard mask layer 118 because the "aspect ratio" of the open spaces between the features is large enough to effectively serve as an etch mask to prevent etching of the exposed portions of the hard mask layer 118, as is understood by those of ordinary skill in the art. In another embodiment, the etch chemistry selected to etch the spacers S1, S2, S3, S4, S5, S6, S7 and S8 is chosen to be selective to both the sacrificial mandrel features 122, 124, 126, and 128 and the hard mask layer 118. The etch process can be timed to remove all of the layer of insulating material 140 on the upper surface of the sacrificial mandrel features and pull down the spacers S1, S2, S3, S4, S5, S6, S7 and S8 to a target height on the sidewalls of the sacrificial mandrel features 122, 124, 126, and 128. While the etch back/pull down process effectively makes the spacers S1, S2, S3, S4, S5, S6, S7 and S8 shorter with time, the thickness of the spacers S1, S2, S3, S4, S5, S6, S7 and S8 remains substantially the same thickness $T_S$ of the conformal layer of insulating material 140.

A next phase of the fabrication process comprises performing a multi-angled deposition process to angle-deposit a layer of material over upper portions of the spacers S1, S2, S3, S4, S5, S6, S7 and S8, to form spacer trim masks that are used for etching away exposed portions of the spacers (i.e., trimming the spacers) to adjust the thickness of the spacers. In one embodiment of the invention, a non-specific global spacer trimming process is performed through a multi-angled deposition process flow, as schematically illustrated in FIGS. 6A, 6B, 7, 8, 9A, and 9B. In another embodiment of the invention, multi-angled deposition and masking methods are performed to selectively trim and/or remove one or more spacers using a process flow as schematically illustrated in FIGS. 10, 11A, 11B, 12, 13, 14, 15, 16A, 16B, 17A, 17B, 18, 19A, and 19B. In all of the exemplary embodiments discussed herein, it is to be understood that the spacer trim masks can be formed by angle depositing insulating material or metallic material. For purposes of illustration, however, the embodiments discussed herein may be described in the context of angle depositing insulating material to form spacer trim masks, but in each instance, metallic material can be used instead of insulating material to form the spacer trim masks.

Figure 6A:
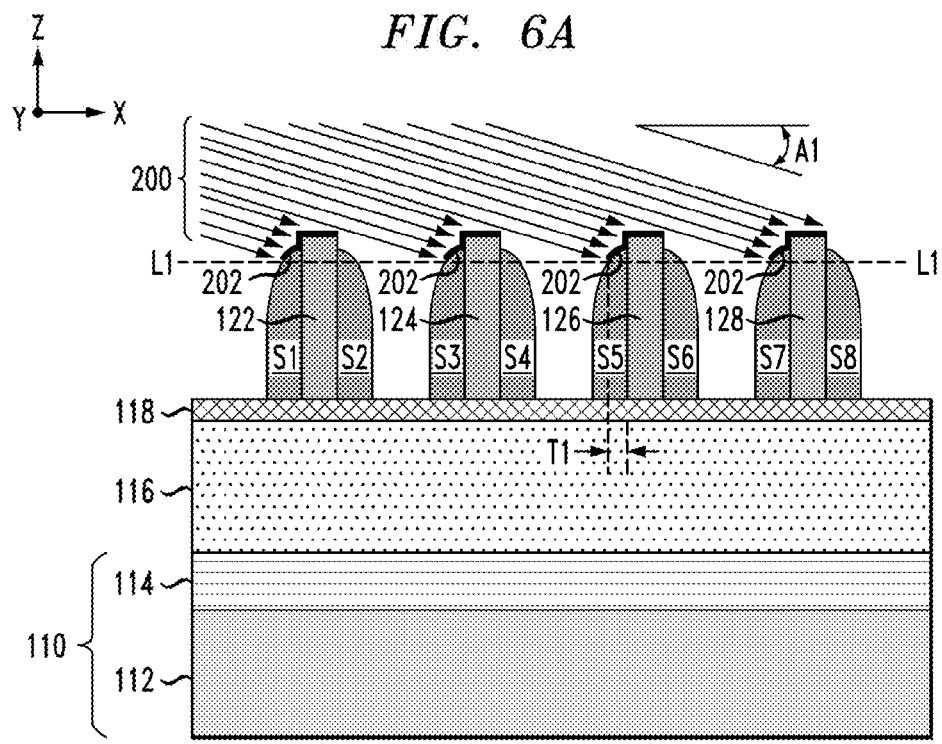
FIG. 6A schematically illustrates an example of an angle deposition process that is performed on the semiconductor structure of FIG. 5A for angle depositing a layer of material at a first deposition angle to form spacer trim masks on the spacers that are disposed on first sidewalls of the sacrificial mandrel features.

In particular, an initial step of a non-specific global spacer trim process according to an embodiment of the invention begins with FIG. 6A, which schematically shows an angle deposition process 200 that is performed on the semiconductor structure of FIG. 5A for angle depositing a layer of insulating material to form a spacer trim mask 202 on an upper portion of each of the spacers S1, S3, S5, and S7 that are disposed on a first sidewall (e.g., left side) of the sacrificial mandrel features 122, 124, 126 and 128. As shown in FIG. 6A, the angle deposition process 200 is performed at first angle A1 to form the spacer trim masks 202 which cover upper portions of the left side spacers S1, S3, S5, and S7 at a target level L1 (indicated by line L1-L1) and above. As further shown in FIG. 6A, the portions of the spacers S1, S3, S5, and S7 which are covered by the spacer trim masks 202 have a thickness T1. The thickness T1 is a function of the pitch P of the sacrificial mandrel features 122, 124, 126, and 128 and the deposition angle A1, as the upper portions of the sacrificial mandrel features 122, 124, 126, and 128 essentially block the insulating material from being deposited on the spacers S1, S3, S5, and S7 below the target level L1. The deposition angle can be decreased or increased to form a larger or smaller spacer trim mask on the upper portion of the spacers.

Figure 6B:
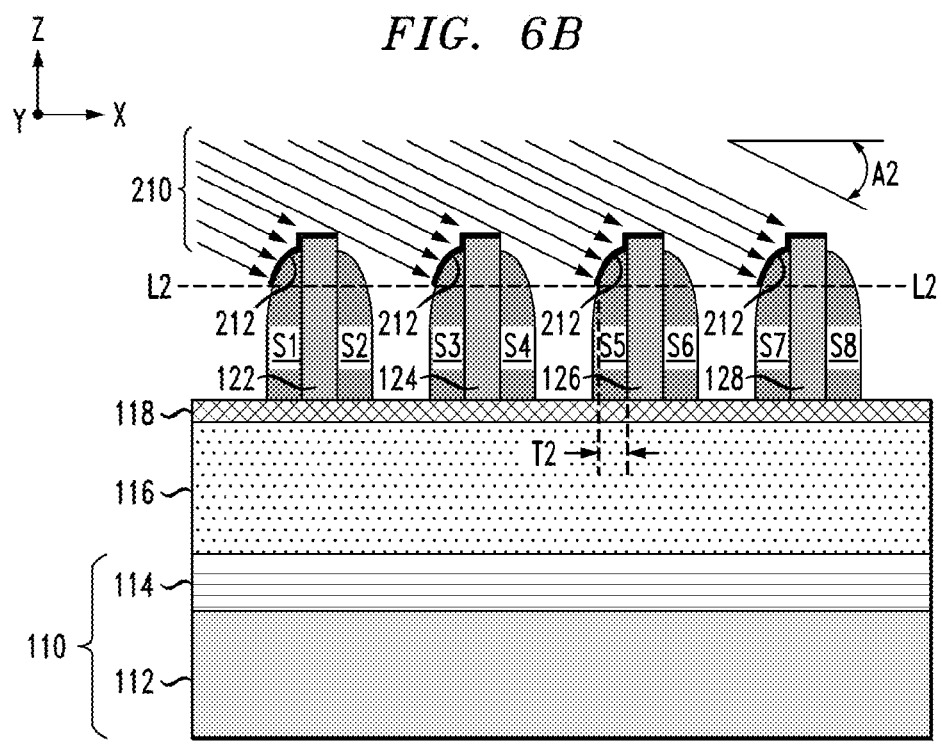
FIG. 6B schematically illustrates another example of an angle deposition process that is performed on the semiconductor structure of FIG. 5A for angle depositing a layer of material at second deposition angle (which is greater than the first deposition angle of FIG. 6A) to form spacer trim masks on the spacers that are disposed on the first sidewalls of the sacrificial mandrel features.

For example, 6B schematically shows another exemplary angle deposition process 210 that can be performed on the semiconductor structure of FIG. 5A for angle depositing a layer of insulating material to form a spacer trim mask 212 on an upper portion of each of the spacers S1, S3, S5, and S7 that are disposed on the first sidewalls (e.g., left side) of the sacrificial mandrel features 122, 124, 126 and 128. In particular, FIG. 6B schematically illustrates the angle deposition process 210 being performed at a second angle A2, which is greater than the first deposition angle A1 of the angle deposition process 200 schematically shown in FIG. 6A. In this regard, as shown in FIG. 6B, the insulating material is deposited on the upper portions of the spacers S1, S3, S5, and S7 at a level L2 (as indicated by the line L2-L2) which is lower than the level L1 shown in FIG. 6A. As such, the portions of the spacers S1, S3, S5 and S7 which are covered by the spacer trim masks 212 have a thickness T2, which is greater than the thickness T1 of the portions of the spacers S1, S3, S5, and S7 which are covered by the spacer trim masks 202 in FIG. 6A.

Figure 7:
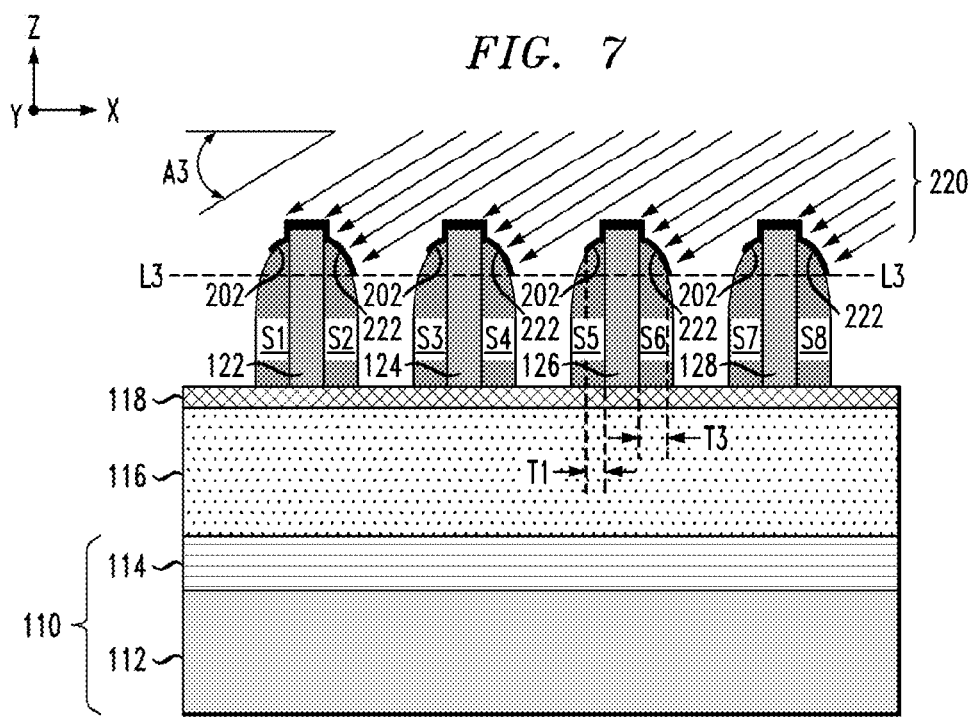

A next step of the non-specific global spacer trim process is shown in FIG. 7, which schematically illustrates an angle deposition process 220 that is performed on the semiconductor structure of FIG. 6A for angle depositing a layer of insulating material to form a spacer trim mask 222 on an upper portion of each of the spacers S2, S4, S6, and S8 that are disposed on a second sidewall (e.g., right side) of the sacrificial mandrel features 122, 124, 126 and 128. As shown in FIG. 7, the angle deposition process 220 is performed at third angle A3 to form the spacer trim masks 222 which cover upper portions of the right side spacers S2, S4, S6 and S8 at a target level L3 (indicated by line L3-L3) and above. As further shown in FIG. 7, the portions of the spacers S2, S4, S6 and S8 which are covered by the spacer trim masks 222 have a thickness T3. As noted above, the thickness T3 is a function of the pitch P of the sacrificial mandrel features 122, 124, 126, and 128 and the deposition angle A3, as the upper portions of the sacrificial mandrel features 122, 124, 126, and 128 essentially block the insulating material from being deposited on the sides of the spacers S2, S4, S6, and S8 below the target level L3.

It is to be understood that FIG. 7 is an example embodiment in which the deposition angles A1 and A3 that are used to deposit the insulating material that form the spacer trim masks 202 and 222 is different for the left side and right side spacers, which enables non-symmetrical trimming of the spacers disposed on the opposing first and second sidewalls of the sacrificial mandrel features 122, 124, 126 and 128. In another embodiment, the deposition angles A1 and A3 that are used to deposit the insulating material that form the spacer trim masks 202 and 222 can be the same for the left side and right side spacers, which enable symmetrical trimming of the spacers disposed on the opposing first and second sidewalls of the sacrificial mandrel features 122, 124, 126 and 128. In another embodiment, the deposition angle that is used to deposit insulating material on the spacers on one sidewall (e.g., first sidewall or second sidewall) of the sacrificial mandrel features 122, 124, 126, and 128 can be large enough to essentially cover most or all of the surface of the spacers so that such spacers are not trimmed during a subsequent spacer trim process (FIG. 8), and are maintained with the initial thickness $T_S$.

The insulating material that is used to form the spacer trim masks (e.g., trim masks 202, 212, 222) may comprise any insulating material that is suitable for use as a trim mask and which has high etch selectively with respect to the material that forms the spacers S1~S8. For example, the spacer trim masks can be formed of an oxide material (e.g., silicon oxide, hafnium oxide) or a nitride material (e.g., silicon nitride). The spacer trim masks can be formed with a thickness in a range of about 1 nm to about 10 nm. The angle depositions (e.g., 200, 210, and 220) methods as described herein can be implemented using known techniques. For example, the angle deposition operations can be performed using plasma CVD (chemical vapor deposition) techniques and equipment as disclosed in U.S. Pat. No. 9,080,239, entitled: Method and Apparatus For Angular High Density Plasma Chemical Vapor Deposition,", which is commonly owned and incorporated herein by reference.

In other embodiments, the trim masks 202, 212, and 222 are formed by angle depositing a metallic material. In some instances, a metallic material can provide better etch selectivity for a spacer trim process (as discussed below), as compared to using an insulating material to form the spacer trim masks. The types of metallic materials that may be used to form the spacer trim masks include, but are not limited to, tantalum (Ta), titanium (Ti), TaN, TiN, cobalt (Co), or other types of metallic material that are suitable for use as spacer trim masks in the process flows described herein.

Figure 8:
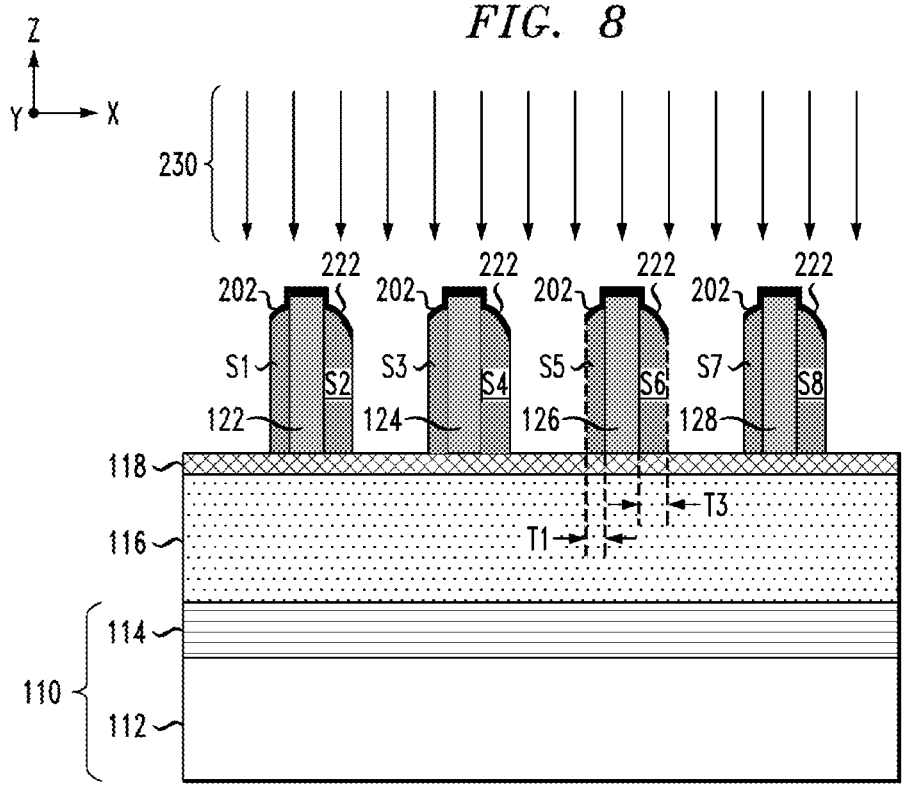

After the spacer trim masks are formed on the spacers S1~S8, a spacer trim etch process is performed to trim the spacers by vertically etching the exposed sidewall portions of the spacers S1~S8. For example, FIG. 8 is a schematic cross-sectional side view of the semiconductor structure of FIG. 7 showing an etch process 230 being performed to trim the exposed sidewall surfaces of the spacers S1~S8 down to the target thicknesses T1 and T3. In particular, as shown in FIG. 8, the spacer trim etch process 230 serves to vertically trim the left-side spacers S1, S3, S5, and S7 to the target thickness T1, wherein the remaining portions of the spacers S1, S3, S5 and S7 are protected from etching by the spacer trim masks 202. Similarly, the spacer trim etch process 230 serves to vertically trim the right-side spacers S2, S4, S6, and S8 to the target thickness T3, wherein the remaining portions of the spacers S2, S4, S6 and S8 are protected from etching by the spacer trim masks 222. The spacer trim etch process 230 can be performed using a directional dry plasma etch (e.g., RIE) with an etch chemistry that is suitable to etch the material of the spacers S1~S8 selective to the material of the spacer trim masks 202 and 222 (e.g., etch ratio of 10:1 or greater).

Figure 9A:
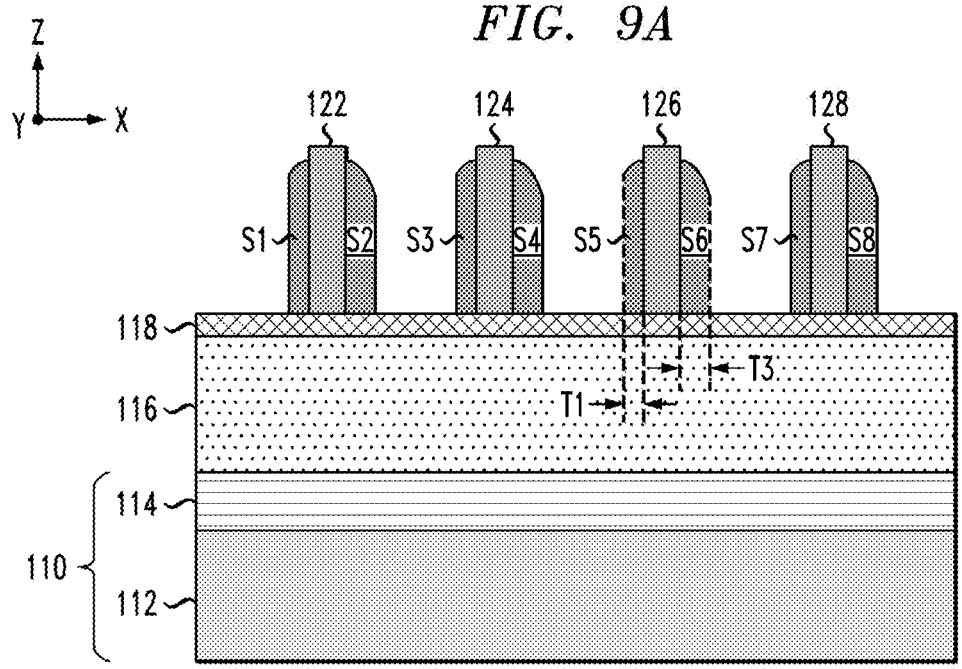
Figure 9B:
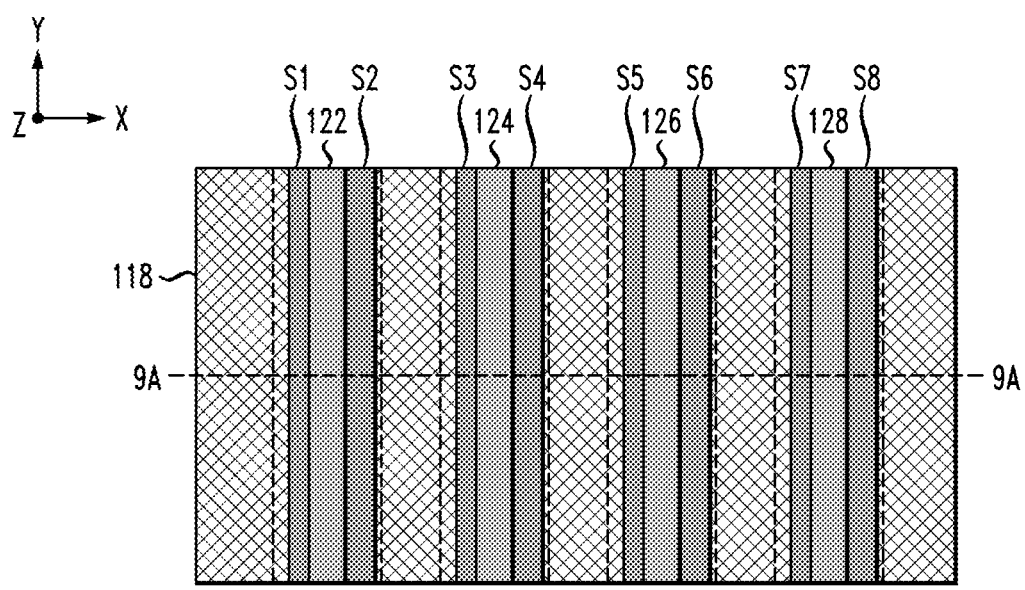

Following the spacer trim etch process, the spacer trim masks 202 and 222 are removed, resulting in the semiconductor structure shown in FIGS. 9A and 9B. In particular, FIG. 9A is a schematic cross-sectional side view of the semiconductor structure of FIG. 8 (as well as a schematic cross-sectional view taken along line 9A-9A in FIG. 9B) after removing the spacer trim masks 202 and 222 from the upper surfaces of the spacers S1, S2, S3, S4, S5, S6, S7, and S8 and the upper surfaces of the sacrificial mandrel features 122, 124, 126, and 128. FIG. 9B is a schematic top plan view of the semiconductor structure of FIG. 9A, wherein the original thickness profiles of the spacers S1, S2, S3, S4, S5, S6, S7, and S8 are shown as dashed lines. The spacer trim masks 202 and 222 can be removed using a dry plasma etch process with an etch chemistry that is suitable to etch the material of the spacer trim masks 202 and 222 selective to the material of the spacers S1-S8. In this etch process, a small amount of the upper portions of the sacrificial mandrel features 122, 124, 126 and 128 may be etched in instances where the sacrificial mandrel features and spacer trim masks are formed with the same or similar materials where the etch selectivity between the materials is low.

The resulting semiconductor structure shown in the example embodiment of FIGS. 9A and 9B comprises asymmetrically-sized spacers that are differentially trimmed to have different thicknesses T1 and T3 on opposing sides of the sacrificial mandrel features 122, 124, 126, and 128. The trimmed spacer thicknesses T1 and T3 are below the CD (critical dimension) that can be achieved for the given semiconductor process technology that is implemented. As noted above, in another embodiment of the invention, an angle deposition and spacer etch process flow can be performed using the techniques as discussed above to form symmetrically-sized spacers that are trimmed to have the same thickness (sub-CD thickness) on the opposing sides of the sacrificial mandrel features 122, 124, 126 and 128.

Following the formation of the semiconductor structure shown in FIGS. 9A and 9B, the process flow may continue, for example, by encapsulating the spacers and sacrificial mandrel features in a planarized insulating layer (e.g., organic planarizing layer) and forming a "cut mask" that is used to etch the planarized insulating layer to expose, and then "cut" away, the extra spacer material on the ends of the sacrificial mandrel features 122, 124, 126, and 128. The "cut" process would essentially "isolate" the spacers on the sidewalls of the mandrel (e.g., isolate the spacers S1 and S2 on opposing sidewalls of mandrel 122). Indeed, although not specifically shown in FIG. 5B, after the spacer etch back/pull down process, each sacrificial mandrel 122, 124, 126, and 128 would essentially be surrounded by one continuous sidewall spacer formed around the sidewalls of the sacrificial mandrel features. The spacer material on the end sidewalls of each mandrel 122, 124, 126 and 128 would be "cut away" (after the spacer trim/selective spacer removal process discussed above) using the cut mask as an etch mask to etch away the portions of spacer material on the ends of sacrificial mandrel features 122, 124, 126, and 126, thereby forming separate (isolated) spacers S1/S2, S3/S4, S5/S6, and S7/S8 on the opposing sidewalls of the respective sacrificial mandrel features 122, 124, 126, and 128.

Thereafter, the cut mask and planarized insulating layer are removed. Then, the process flow may continue by removing the sacrificial mandrel features 122, 124, 126, and 128, etching the underlying hard mask layer 118 using the trimmed spacers S1, S2, S3, S4, S5, S6, S7, and S8 as etch masks to transfer the pattern of the trimmed spacers into a hard mask pattern, and then using the patterned hard mask to etch the underlying insulating layer 116.

It is to be appreciated that the pattern of trimmed spacers as shown in FIGS. 9A and 9B enable the formation of a pattern of structures with alternating widths (e.g., alternating between T1 and T3) which comprise sub-lithographic dimensions. For example, the pattern of the trimmed spacers can be transferred to the insulating layer 116 to enable the formation of metal lines which have alternating sized spaces (T1 and T3) on the left and the right sides of the metal lines. In another embodiment, assuming that the layer 116 comprises a layer of semiconductor material (e.g., silicon), the spacer pattern of FIGS. 9A and 9B could be used to etch vertical semiconductor fins (for FinFET devices) in the underlying layer 116 to fabricate a pattern of vertical semiconductor fins with alternating widths of T1 and T3 of sub-lithographic width dimensions.

Figure 10:
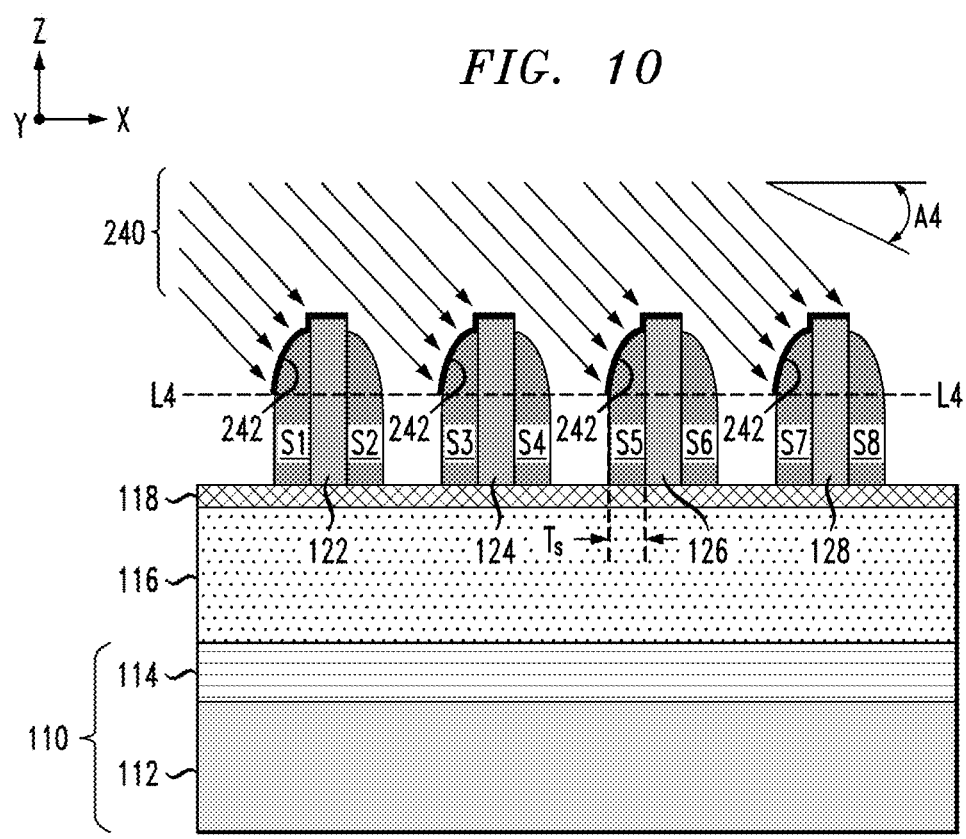

As noted above, another embodiment of the invention utilizes multi-angled deposition and masking methods to selectively trim and or remove one or more spacers using a process flow as schematically illustrated in FIGS. 10, 11A, 11B, 12, 13, 14, 15, 16A, 16B, 17A, 17B, 18, 19A, and 19B. In particular, FIG. 10 schematically shows an angle deposition process 240 that is performed on the semiconductor structure of FIG. 5A for angle depositing a layer of insulating material to form spacer trim masks 242 on the upper portions of the spacers S1, S3, S5, and S7 that are disposed on a first sidewall (e.g., left side) of the sacrificial mandrel features 122, 124, 126 and 128. As shown in FIG. 10, the angle deposition process 240 is performed at an angle A4 to form the spacer trim masks 242 which cover upper portions of the left side spacers S1, S3, S5 and S7 at a target level L4 (indicated by line L4-L4) and above. As further shown in FIG. 10, the portions of the spacers S1, S3, S5 and S7 which are covered by the spacer trim masks 242 have a thickness $T_S$, which is the original thickness of the spacers.

It is to be understood that FIG. 10 illustrates one exemplary embodiment in which the spacers S1, S3, S5, and S7 are not trimmed in subsequent spacer removal/trimming processes. The deposition angle A4 is selected so that the resulting spacer trim masks 242 are formed with sufficient coverage on the upper portions of the spacers S1, S3, S5, and S7 to prevent trimming of the spacers S1, S3, S5, and S7. In another embodiment, the deposition angle A4 of the angle deposition process 240 can be decreased to a lower angle (e.g., angle A1 (FIG. 6A) or angle A2 (FIG. 6B)) which is sufficient to form spacer trim masks that enable one or more of the left side spacers S1, S3, S5, and S7 to be selectively trimmed in subsequent spacer removal/trimming processes.

Figure 11A:
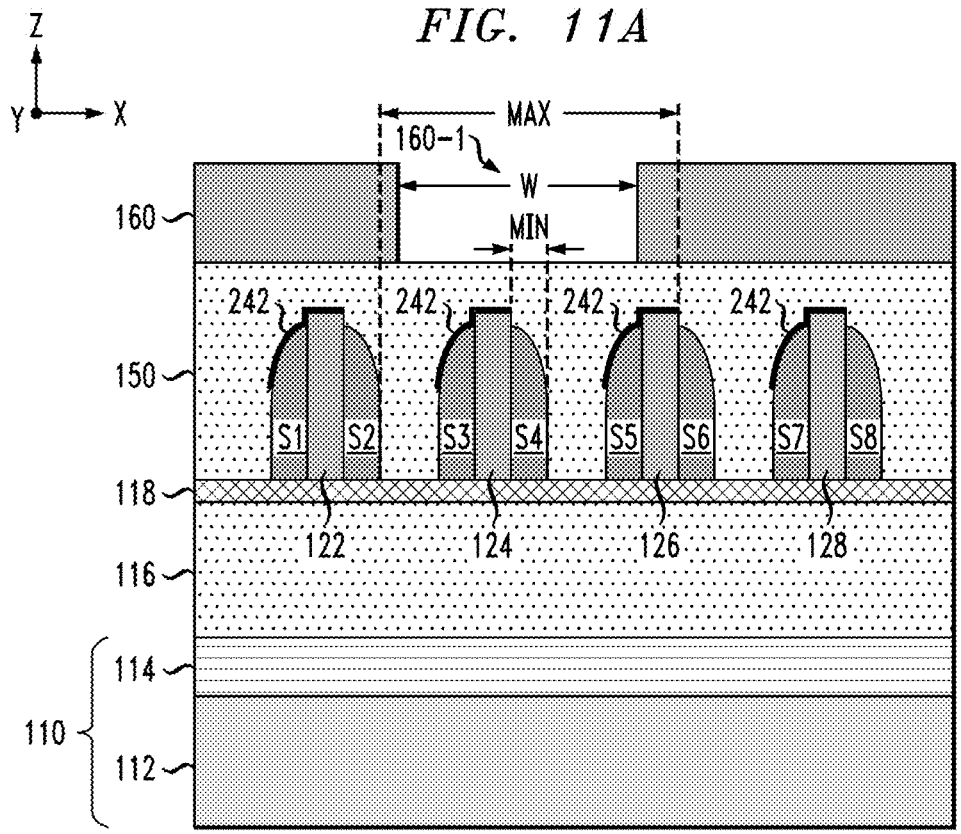
FIGS. 11A and 11B schematically illustrate the semiconductor structure of FIG. 10 after encapsulating the spacer and sacrificial mandrel features in a first planarized insulating layer and forming a first etch mask on the first planarized insulating layer.
Figure 11B:
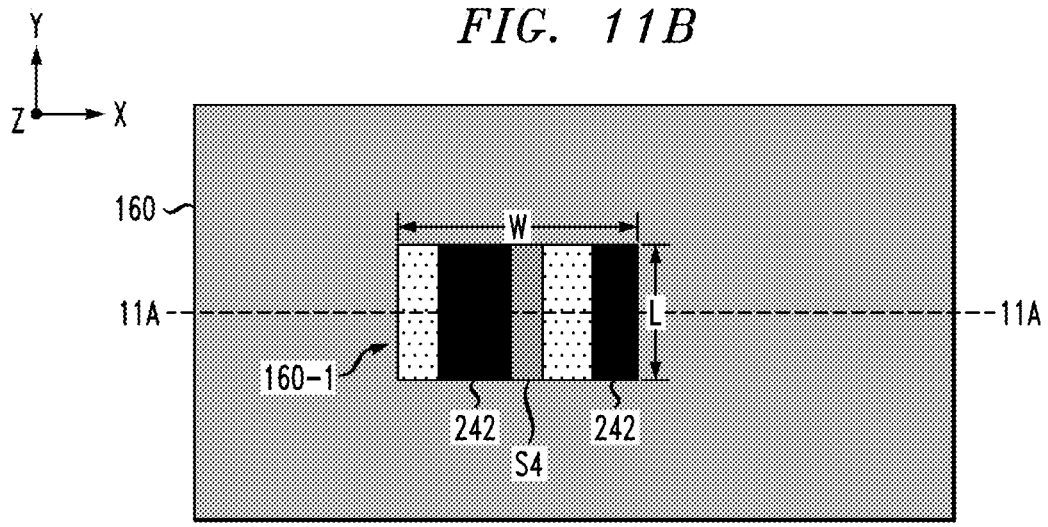

A next phase of the process flow comprises encapsulating the spacer and sacrificial mandrel features in a planarized insulating layer and forming an etch mask to selectively remove and/or trim one on or more spacers. For example, FIG. 11A is a schematic cross-sectional side view of the semiconductor structure of FIG. 10 after forming a planarized insulating layer 150 over the spacer/mandrel features, and forming an etch mask 160 on the planarized insulating layer 150. The etch mask 160 is formed with an opening 160-1. FIG. 11B is a schematic top plan view of the semiconductor structure of FIG. 11A, wherein FIG. 11A is a cross-sectional view of the semiconductor structure taken along line 11A-11A shown in FIG. 11B.

In one embodiment of the invention, the planarized insulating layer 150 comprises an OPL (organic planarizing layer). In particular, the planarized insulating layer 150 can be formed by depositing an organic material using a known deposition technique (e.g., spin on deposition) which allows the organic material to be deposited with a planarized surface. This allows the planarized insulating layer 150 to be formed without the need for performing an additional planarizing step such as CMP (chemical mechanical polishing) to planarize the layer of insulating material after it is deposited. In other embodiment, the insulating layer 150 can be formed by depositing and planarizing a layer of insulating material. The planarized insulating layer 150 is formed of an insulating material that can be etched selective to the material used to form the spacer trim masks 242.

Further, in one embodiment, the etch mask 160 may be a photoresist mask that is formed using known photolithographic methods. As shown in FIG. 11A, the opening 160-1 of the etch mask 160 has a width W (in the X-direction) which falls between a maximum width (Max) and a minimum width (Min). Further, as shown in FIG. 11B, the opening 160-1 is formed with a length L (in the Y-direction), which exposes a portion (of length L) of spacer S4. FIGS. 11A and 11B illustrate an exemplary embodiment for selectively removing a portion of the spacer S4 (e.g., length L of the spacer S4). The Max and Min widths of the opening 160-1 of the etch mask 160 represent the allowable range of widths (dimensional tolerances) from the minimum width to the maximum width with which the opening 160-1 can be formed in the X-direction to selectively remove a portion (length L) of the spacer S4 without etching the adjacent (unprotected) spacers S2 and S6. In the example embodiment, the spacers S3 and S5 are protected by the spacer masks 242, which allows for a larger Max width of the opening 160-1.

In this regard, it is to be appreciated that the angle deposition in conjunction with the etch mask patterning enables the selective removal of narrow spacer features (e.g., with thickness $T_S$) in instances when the given photolithography process that is implemented is insufficient to form narrow mask openings that are sufficient to selectively etch a spacer or other target feature. In particular, assuming that that the opening 160-1 of the etch mask 160 cannot be formed with the minimum width (Min), the opening 160-1 can be formed with a larger width (up to Max width) to selectively etch the target spacer S4 without etching the adjacent (protected) spacers S3 and S5.

Figure 12:
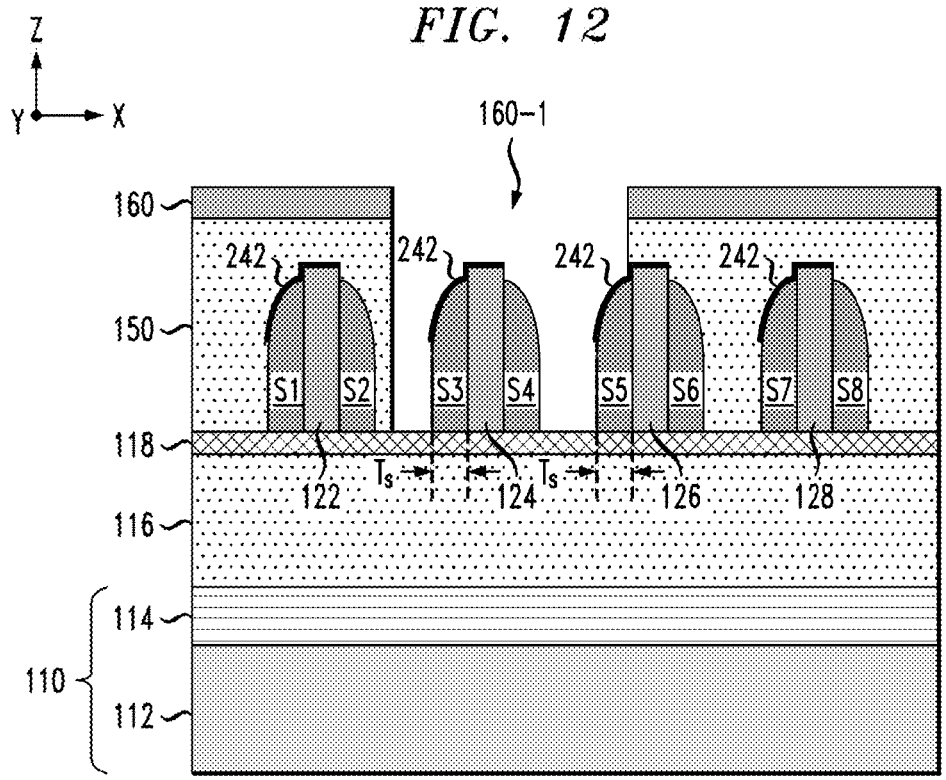

A next step in the fabrication process comprises etching away the exposed portions of the planarized insulating layer 150 and the spacer S4, which are exposed through the opening 160-1 of the etch mask 160. For example, FIG. 12 is a schematic cross-sectional side view of the semiconductor structure of FIG. 11A after etching the exposed portion of the planarized insulating layer 150 down to the hard mask layer 118, and selectively removing the portion of the spacer S4 exposed through the opening 160-1 of the etch mask 160. In one embodiment of the invention, the etch process is performed using single etch process having an etch chemistry that is suitable to concurrently etch away the materials of the insulating layer 150 and the spacer S4. In another embodiment, a first etch process can be performed to remove the exposed portion of the insulating layer 150, followed by a second etch process to remove the exposed portion of the spacer S4. The etching is performed selective to the material of the spacer masks 242 to prevent etching of the adjacent spacers S3 and S5.

Figure 13:
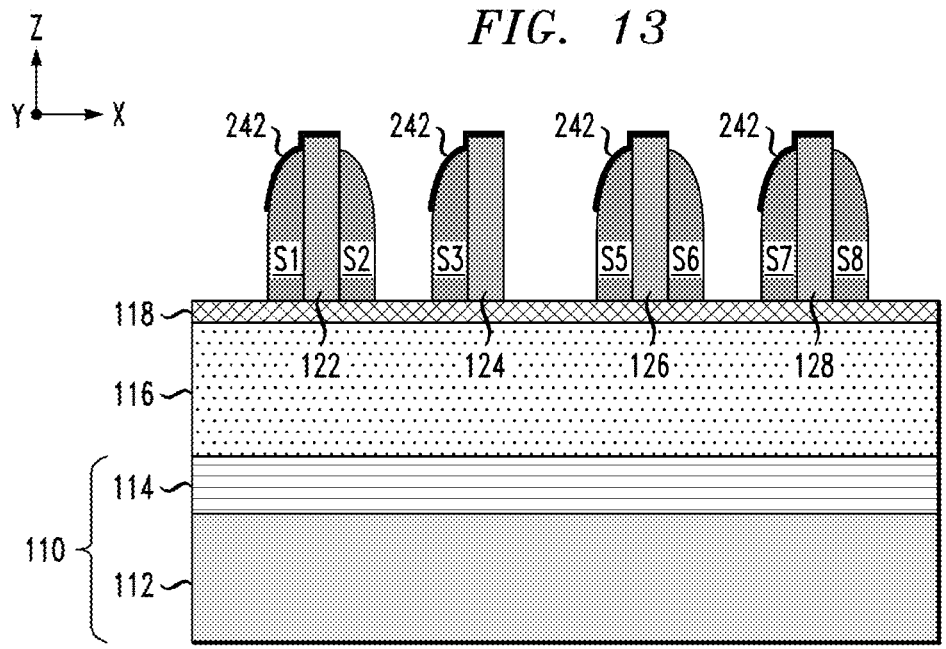
Figure 14A:
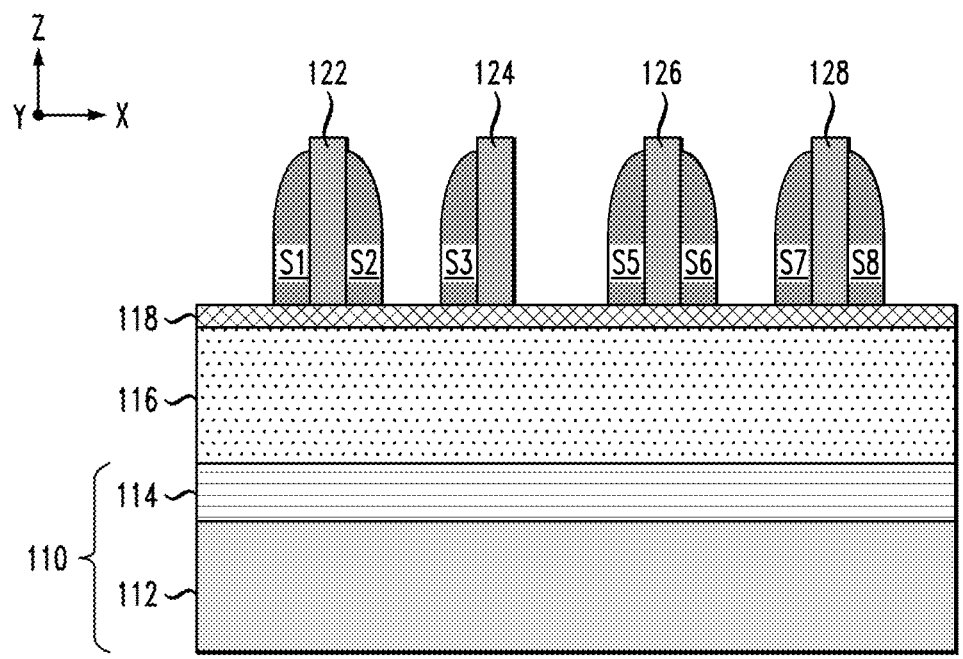
FIGS. 14A and 14B schematically illustrate the semiconductor structure of FIG. 13 after removing the spacer trim masks from the spacers disposed on first sidewalls of the sacrificial mandrel features.
Figure 14B:
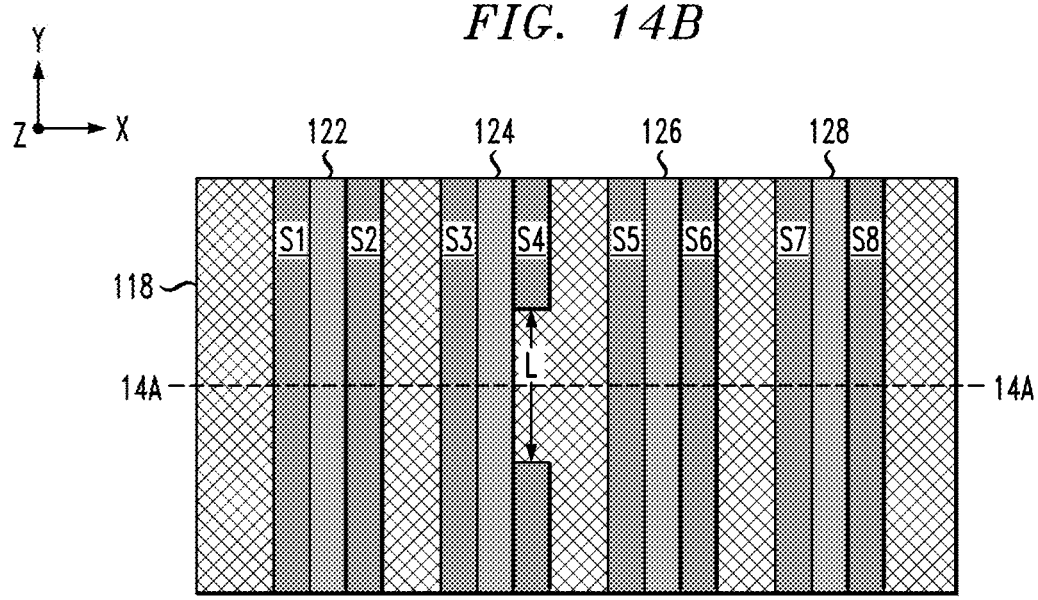

A next stage of the process flow comprises selectively patterning/trimming one or more of the right-side spacers S2, S4, S6, S8, which are formed on the opposite sides of the sacrificial mandrel features 122, 124, 126, 128. In particular, as an initial step, FIG. 13 is a schematic cross-sectional side view of the semiconductor structure of FIG. 12 after removing the remaining portions of the etch mask 160 and the planarized insulating layer 150, selective to the spacers S1~S8 and the spacer masks 242. In addition, as a next step, FIG. 14A is a schematic cross-sectional side view of the semiconductor structure of FIG. 13 after removing the spacer masks 242 selective to the spacers S1~S8 and the sacrificial mandrel features 122, 124, 126, and 128. FIG. 14A is a cross-sectional view of the semiconductor structure taken along line 14A-14A in FIG. 14B. FIG. 14B is a schematic top plan view of the semiconductor structure of FIG. 14A. FIG. 14B illustrates the resulting structure in which a length portion L of the spacer S4 is selectively removed as a result of the previously described angle deposition and etch processes.

Figure 15:
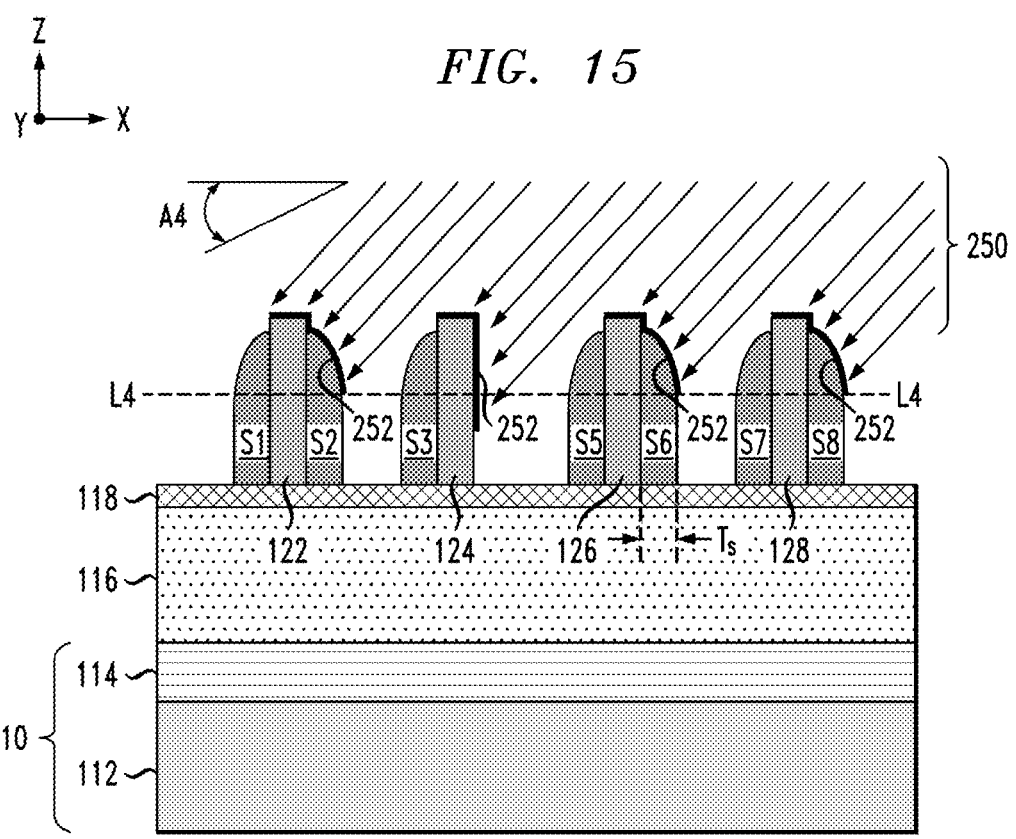

Next, FIG. 15 schematically shows an angle deposition process 250 that is performed on the semiconductor structure of FIGS. 14A and 14B for angle depositing a layer of insulating material to form spacer trim masks 252 on the upper portions of the spacers S2, S4, S6, and S8 that are disposed on the second sidewalls (e.g., right sides) of the sacrificial mandrel features 122, 124, 126 and 128. Since a portion (length L) of the spacer S4 was previously etched away (FIG. 14B) from the sidewall of the sacrificial mandrel feature 124, some insulating material of the spacer trim mask 252 is shown in FIG. 15 being deposited on the sidewall of the portion of the sacrificial mandrel feature 124 which is not covered by the spacer S4. Similar to the angle deposition process of FIG. 10, as shown in FIG. 15, the angle deposition process 250 is performed at an angle A4 to form the spacer trim masks 252 which cover upper portions of the spacers S2, S4, S6 and S8 at a target level L4 (indicated by line L4-L4) so that the portions of the spacers S2, S4, S6 and S8 which are covered by the spacer trim masks 252 have a thickness $T_S$, which is the original thickness of the spacers.

It is to be understood that FIG. 15 illustrates one exemplary embodiment in which the spacers S2, S4, S6, and S8 are not trimmed in subsequent spacer removal/trimming processes. The deposition angle A4 is selected so that the resulting spacer trim masks 252 are formed with sufficient coverage on the upper portions of the spacers S2, S4, S6, and S8 to prevent trimming of the spacers S2, S4, S6, and S8. In another embodiment, the deposition angle A4 of the angle deposition process 250 can be decreased to a lower angle (e.g., angle A3 (FIG. 7) which is sufficient to form spacer trim masks that enable one or more of the left side spacers S2, S4, S6, and S8 to be selectively trimmed in subsequent spacer removal/trimming processes.

Figure 16A:
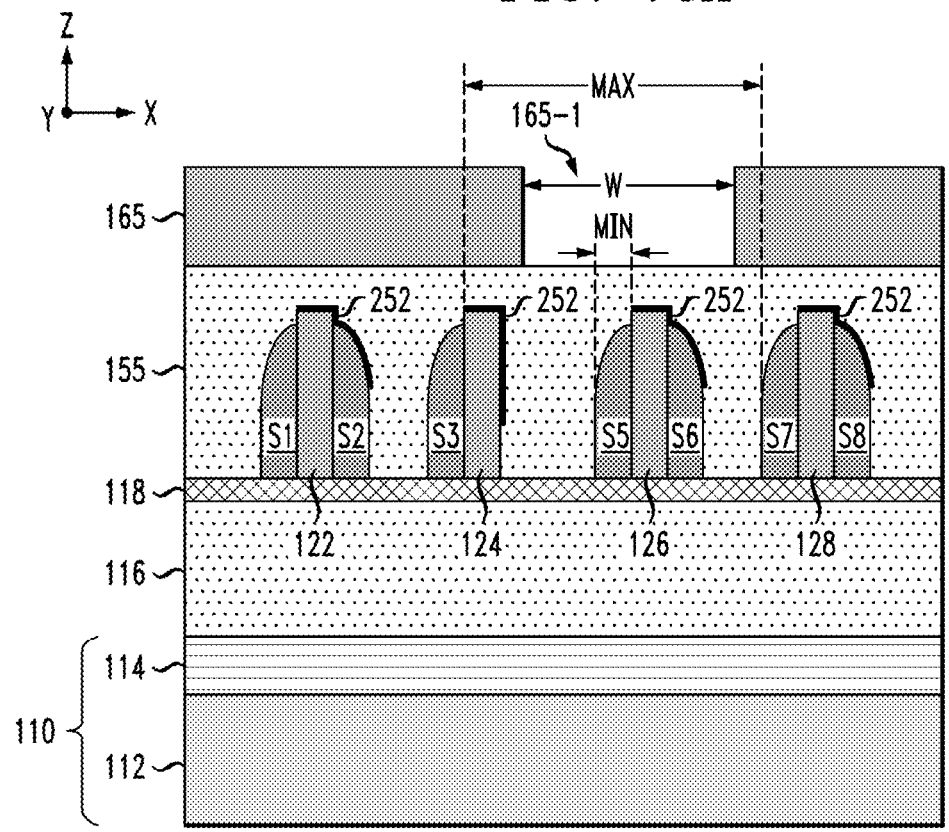
FIGS. 16A and 16B schematically illustrate the semiconductor structure of FIG. 15 after encapsulating the spacer and sacrificial mandrel features in a second planarized insulating layer and forming a second etch mask on the second planarized insulating layer.
Figure 16B:
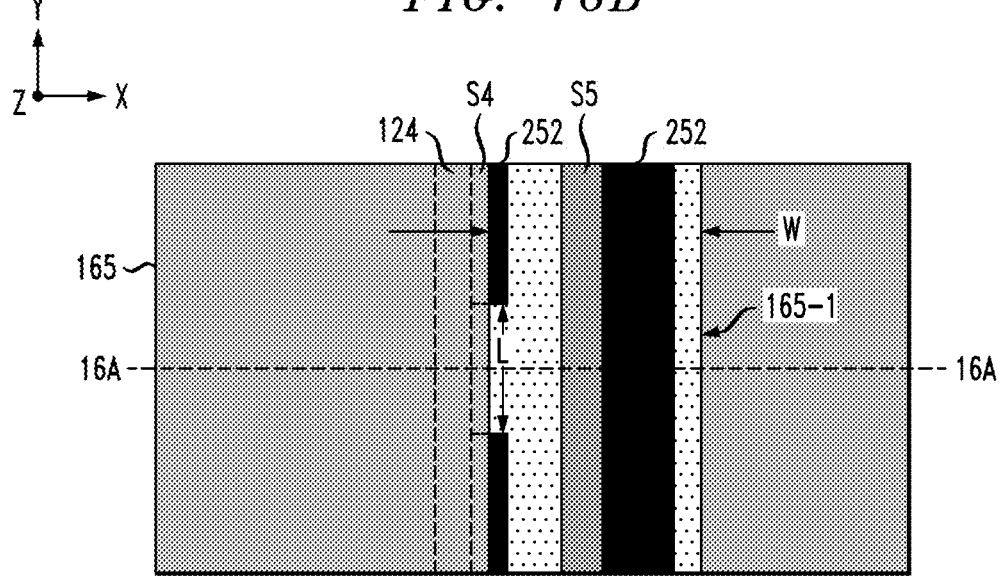

A next phase of the process flow comprises encapsulating the spacer and sacrificial mandrel features in a planarized insulating layer and forming an etch mask to selectively remove and/or trim one or more of the spacers. For example, FIG. 16A is a schematic cross-sectional side view of the semiconductor structure of FIG. 15 after forming a planarized insulating layer 155 over the spacer/mandrel features, and forming an etch mask 165 on the planarized insulating layer 155. The etch mask 165 is formed with an opening 165-1. FIG. 16B is a schematic top plan view of the semiconductor structure of FIG. 16A, wherein FIG. 16A is a cross-sectional view of the semiconductor structure taken along line 16A-16A shown in FIG. 16B. The planarized insulating layer 155 and etch mask 165 can be formed of the same or similar materials and methods as the planarized insulating layer 150 and etch mask 160 discussed above with reference to FIG. 11A/11B As shown in FIG. 16A, the opening 165-1 of the etch mask 165 has a width W (in the X-direction) which falls between a maximum width (Max) and a minimum width (Min). Further, as shown in FIG. 16B, the opening 165-1 is formed over an entire length (in the Y-direction) of the spacer S5. FIGS. 16A and 16B illustrate an exemplary embodiment for selectively removing the entire spacer S5. The Max and Min widths of the opening 165-1 of the etch mask 160 represent the allowable range of widths (dimensional tolerances) from the minimum width to the maximum width with which the opening 165-1 can be formed in the X-direction to selectively remove the spacer S5 without etching the adjacent (unprotected) spacers S3 and S7. In the example embodiment, the remaining portion of the spacer S4 and the full length of the spacer S6 are protected by the spacer masks 252, which allows for a larger Max width of the opening 165-1 to be utilized in circumstances where, as noted above, the given photolithography process that is implemented is insufficient to form narrow mask openings that correspond to the dimensions (e.g., $T_S$) of the features (e.g. spacers) to be selectively etched.

Figure 17A:
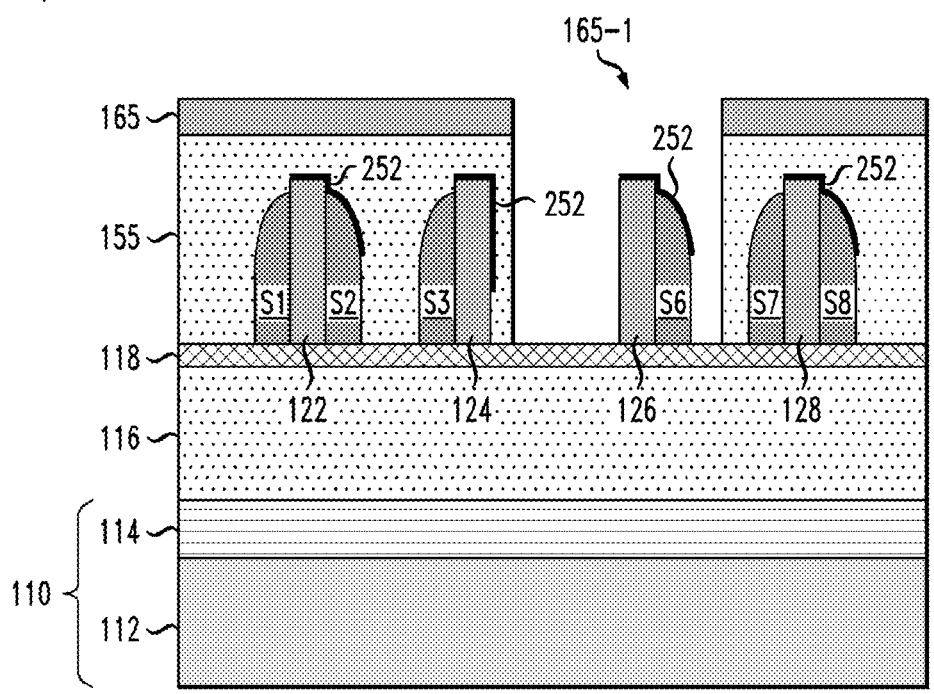
FIGS. 17A and 17B schematically illustrate the semiconductor structure shown in FIGS. 16A and 16B after etching exposed portions of the second planarized insulating layer and a target spacer through an opening of the second etch mask.
Figure 17B:
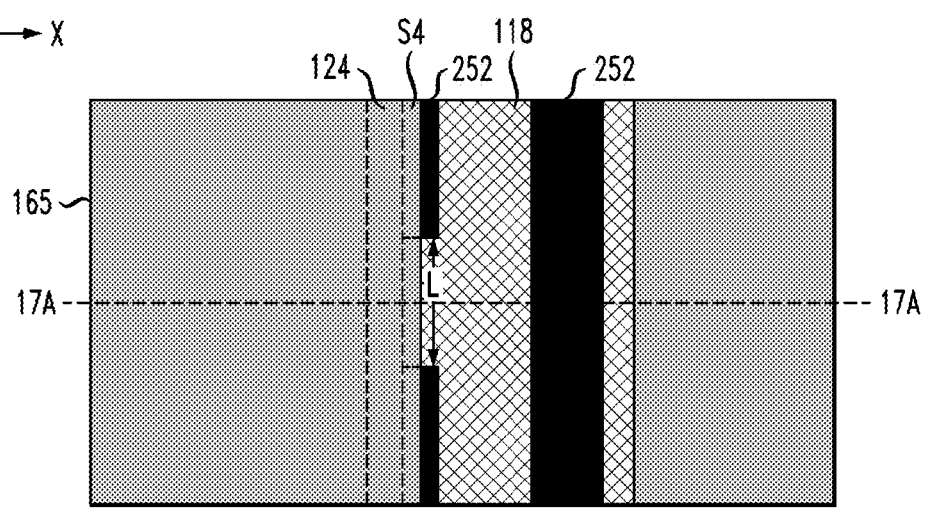

A next step in the fabrication process comprises etching away the exposed portions of the planarized insulating layer 155 and the spacer S5, which are exposed through the opening 165-1 of the etch mask 165. For example, FIG. 17A is a schematic cross-sectional side view of the semiconductor structure of FIG. 16A after etching the exposed portion of the planarized insulating layer 155 down to the hard mask layer 118, and selectively removing the entire spacer S5 exposed through the opening 165-1 of the etch mask 165. Further, FIG. 17B is top plan view of the semiconductor structure shown in FIG. 16B after etching the exposed portion of the planarized insulating layer 155 down to the hard mask layer 118, and selectively removing the entire spacer S5 exposed through the opening 165-1 of the etch mask 165. The insulating layer 155 and spacer S5 can be etched using the same or similar methods discussed above with reference to FIG. 12 for etching the insulating spacer 150 and spacer S4.

Figure 18:
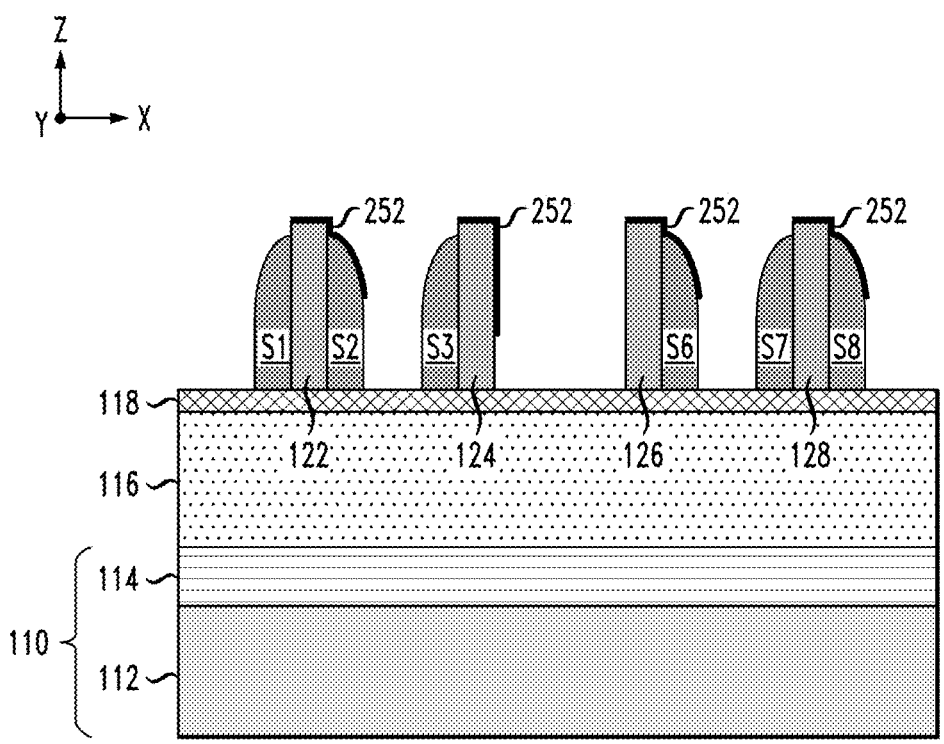
Figure 19A:
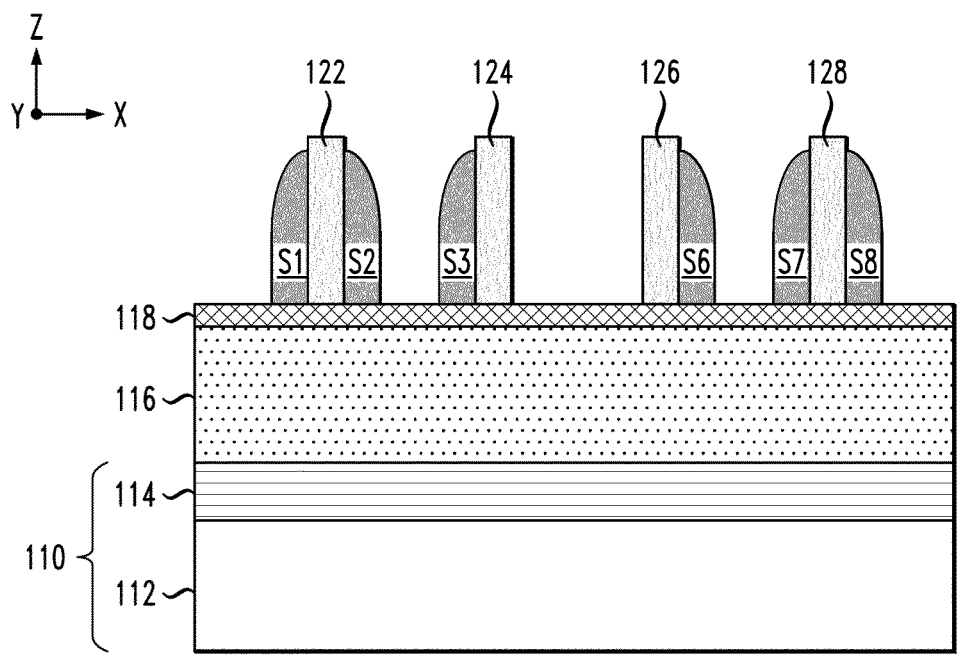
Figure 19B:
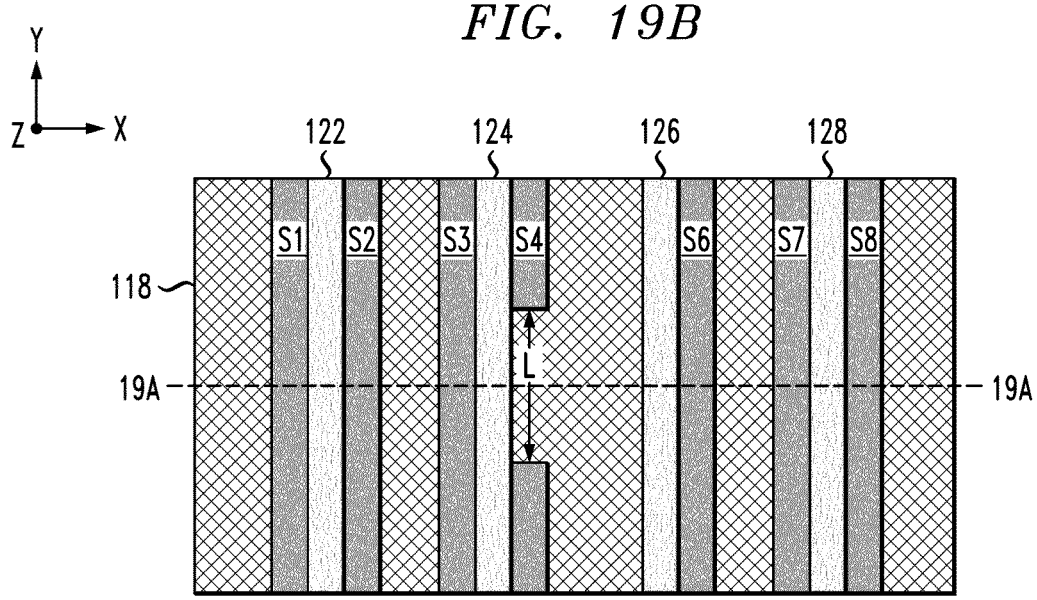

Next, FIG. 18 is a schematic cross-sectional side view of the semiconductor structure of FIG. 17A after removing the remaining portions of the etch mask 165 and the planarized insulating layer 155, selective to the remaining spacers and the masks 252. In addition, as a next step, FIG. 19A is a schematic cross-sectional side view of the semiconductor structure of FIG. 18 after removing the masks 252 selective to the spacers S1, S2, S3, S4, S5, S6, S7 and S8 and the sacrificial mandrel features 122, 124, 126, and 128. FIG. 19A is a cross-sectional view of the semiconductor structure taken along line 19A-19A in FIG. 19B. FIG. 19B is a schematic top plan view of the semiconductor structure of FIG. 19A, which illustrates the resulting structure in which the entire spacer S5 is selective removed, with the adjacent spacer S4 having a length portion L selectively removed from as a result of the previously described angle deposition and etch processes.

The semiconductor structure shown in FIGS. 19A and 19B illustrates one example embodiment in which one or more spacers, or portions of spacers, can be selectively (or singularly) removed using a combination of angle deposition and masking techniques. As noted above, it is to be understood that a combination of angle deposition and masking techniques can be used for selectively trimming a target spacer (or trimming a length portion of a target spacer), while maintaining other spacers at their original thickness. For example, the angle deposition methods discussed above with reference to FIGS. 6A, 6B, 7, 8, 9A, and 9B for symmetric and/or asymmetric spacer trimming can be utilized in conjunction with the masking methods discussed above with reference to FIGS. 11A, 11B, 16A, and 16B to selective trim one or more target spacers to sub-CD thicknesses.

It is to be noted that at some point during or after spacer fabrication process (FIGS. 10 through 19B), the extra spacer material on the ends of the sacrificial mandrel features 122, 124, 126, and 128 could be "cut away" using a cut mask, as discussed above. This cut process may be performed in conjunction with mask/etch process of FIGS. 11A, 11B, and 12, or performed in conjunction with the mask/etch process of FIGS. 16A, 16B, 17A, and 17B, or by a separate cut mask/etch process that is performed subsequent to the formation of the semiconductor structure shown in FIGS. 19A and 19B.

Figure 20:
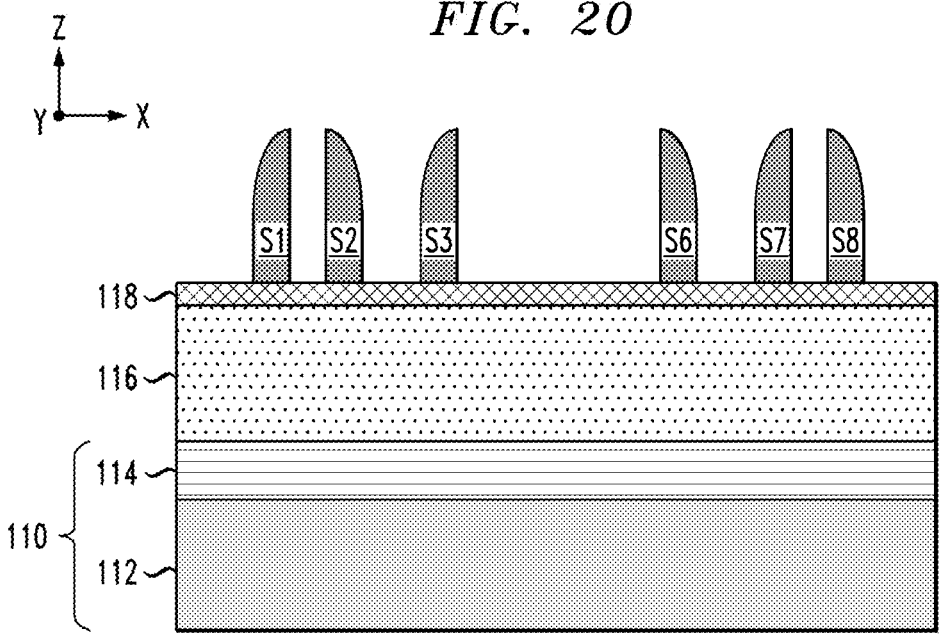
Figure 21:
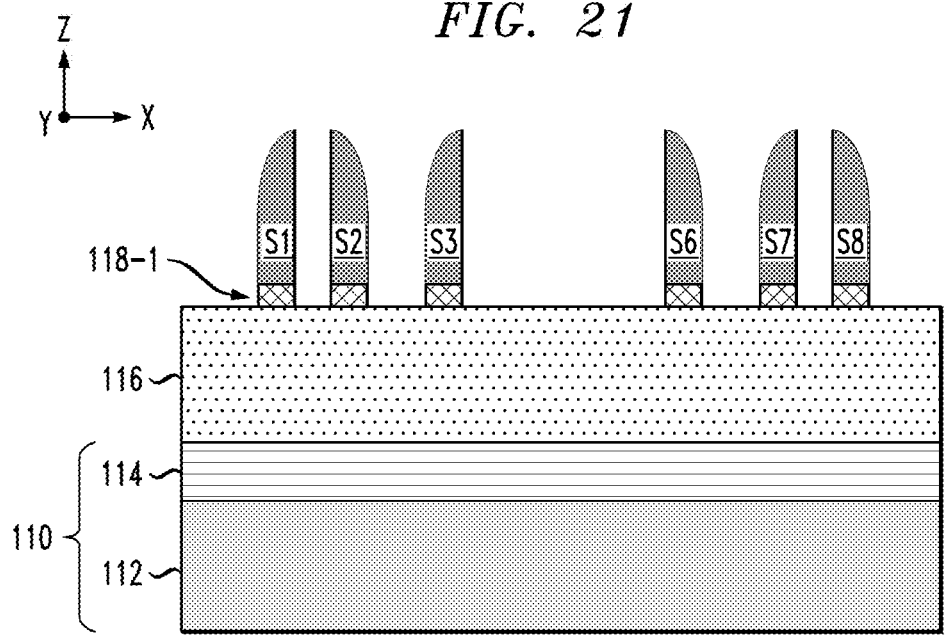
Figure 22:
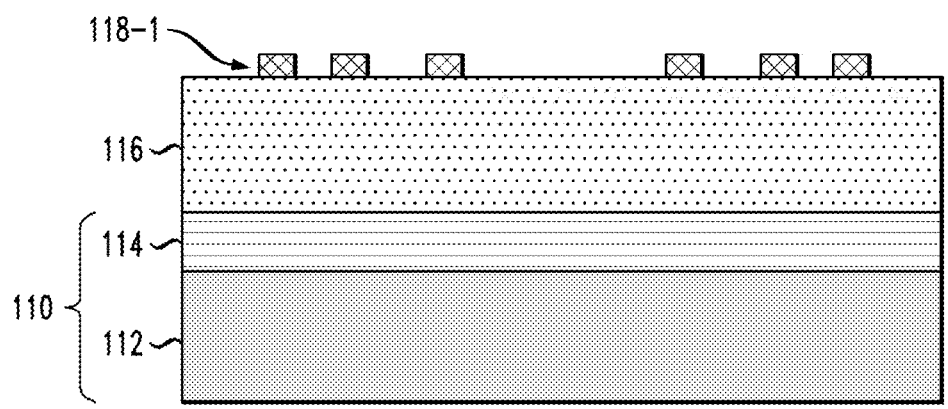
Figure 23:
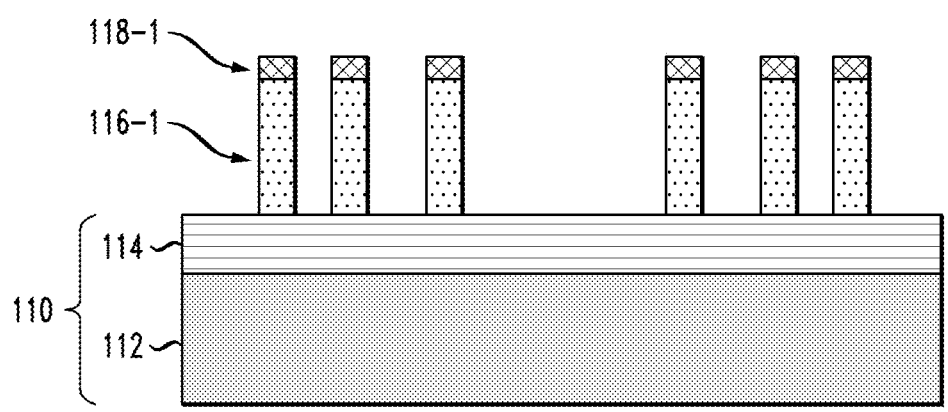

Furthermore, following the formation of the semiconductor structure shown in FIGS. 19A and 19B, the fabrication process may continue using, for example, a process flow as schematically illustrated in FIGS. 20, 21, 22 and 23. For example, FIG. 20 is a schematic cross-sectional side view of the semiconductor structure of FIG. 19A after etching away the sacrificial mandrel features 122, 124, 126, and 128 selective to the spacers. Next, FIG. 21 is a schematic cross-sectional side view of the semiconductor structure of FIG. 20 after etching the underlying hard mask layer 118 using the pattern of spacers as an etch mask to transfer the spacer pattern into the hard mask layer 118 to form a hard mask pattern 118-1. FIG. 22 is a schematic cross-sectional side view of the semiconductor structure of FIG. 21 after selectively etching the spacers from the surface of the hard mask pattern 118-1. FIG. 23 is a schematic cross-sectional side view of the semiconductor structure of FIG. 22 after etching the underlying insulating layer 116 using the hard mask pattern 118-1 as an etch mask to transfer the hard mask pattern 118-1 into an insulating layer pattern 116-1. It is to be understood that depending on the relative etch selectivity of the materials used to form the spacers, the hard mask layer 118 and the insulating layer 116, a single etch process may be performed on the semiconductor structure shown in FIG. 21 to concurrently remove the spacers and etch the underlying insulating layer 116.

For BEOL applications, the patterned insulating layer 116-1 comprises openings that can be filled with metallic material (e.g., copper) to form wiring and interconnects for the given interconnect level of a BEOL interconnect structure. The process flow of FIGS. 20, 21, 22 and 23 can be implemented using well known semiconductor fabrication methods, the details of which are not necessary for understanding embodiments of the invention as discussed herein.

It is to be understood that the multi-patterning methods discussed herein can be incorporated within semiconductor processing flows for fabricating various types of semiconductor devices and integrated circuits having analog and digital circuitry or mixed-signal circuitry. In particular, integrated circuit dies can be fabricated with various devices such as field-effect transistors, bipolar transistors, metal-oxide-semiconductor transistors, diodes, capacitors, inductors, etc. An integrated circuit in accordance with the present invention can be employed in applications, hardware, and/or electronic systems. Suitable hardware and systems for implementing the invention may include, but are not limited to, personal computers, communication networks, electronic commerce systems, portable communications devices (e.g., cell phones), solid-state media storage devices, functional circuitry, etc. Systems and hardware incorporating such integrated circuits are considered part of the embodiments described herein. Given the teachings of the invention provided herein, one of ordinary skill in the art will be able to contemplate other implementations and applications of the techniques of the invention.

Although exemplary embodiments have been described herein with reference to the accompanying figures, it is to be understood that the invention is not limited to those precise embodiments, and that various other changes and modifications may be made therein by one skilled in the art without departing from the scope of the appended claims.

We claim:

1. A semiconductor device, comprising:
a pattern of features formed on a substrate;
wherein each feature in the pattern of features comprises a vertical semiconductor fin formed on the substrate;
wherein the pattern of features comprises adjacent vertical semiconductor fins of alternating widths, wherein the widths of the adjacent vertical semiconductor fins alternate between a first width and a second width such that (i) at least one of the vertical semiconductor fins having the first width is disposed between two adjacent vertical semiconductor fins having the second width and (ii) at least one of the vertical semiconductor fins having the second width is disposed between two adjacent vertical semiconductor fins having the first width; and
wherein the first and second widths of the vertical semiconductor fins comprise sub-lithographic dimensions of a given lithographic process as compared to a minimum critical dimension of at least one other feature of the semiconductor device, which is associated with the given lithographic process.

2. A semiconductor device, comprising:
a pattern of features formed on a substrate;
wherein each feature in the pattern of features comprises a space between metal lines formed in an insulating layer;
wherein the pattern of features comprises adjacent spaces of alternating widths, wherein the widths of the adjacent spaces alternate between a first width and a second width such that (i) at least one of the spaces having the first width is disposed between two adjacent spaces having the second width and (ii) at least one of the spaces having the second width is disposed between two adjacent spaces having the first width; and
wherein the first width and second width of the spaces comprise sub-lithographic dimensions of a given lithographic process as compared to a minimum critical dimension of at least one other feature of the semiconductor device, which is associated with the given lithographic process.

3. A semiconductor device, comprising:
a plurality of mandrels disposed on a substrate, each mandrel comprising opposing first and second sidewalls;
first vertically trimmed spacers disposed on the first sidewalls of the mandrels; and
second vertically trimmed spacers disposed on the second sidewalls of the mandrels;
wherein the first vertically trimmed spacers have a first width;
wherein the second vertically trimmed spacers have a second width;
wherein the first and second vertically trimmed spacers comprise a pattern of spacer features that form an etch mask which is disposed on an underlying layer to be patterned using the etch mask;
wherein the pattern of spacer features comprises adjacent first and second vertically trimmed spacers that alternate between the first and second widths such that (i) at least one of the first vertically trimmed spacers having the first width is disposed between two adjacent second vertically trimmed spacers having the second width and (ii) at least one of the second vertically trimmed spacers having the second width is disposed between two adjacent first vertically trimmed spacers having the first width; and
wherein the first and second widths of the first and second vertically trimmed spacers comprise sub-lithographic dimensions of a given lithographic process as compared to a minimum critical dimension of at least one other feature of the semiconductor device, which is associated with the given lithographic process.

4. The semiconductor device of claim 3, wherein the first width and the second width are substantially equal.

5. The semiconductor device of claim 3, wherein the first width and the second width are different.

6. The semiconductor device of claim 3, wherein the mandrels comprise elongated features which are spaced apart by a pitch, wherein the pitch is about 60 nm or less.

7. The semiconductor device of claim 3, wherein the mandrels comprise elongated features which have a third thickness, wherein the third thickness in a range of about 10 nm to about 15 nm.

8. The semiconductor device of claim 3, wherein the mandrels comprise elongated features which have a height in a range of about 20 nm to about 50 nm.

9. The semiconductor device of claim 3, wherein upper portions of the first vertically trimmed spacers and the second vertically trimmed spacers are recessed below upper surfaces of the mandrels.

10. The semiconductor device of claim 3, wherein the mandrels comprise elongated features, wherein a portion of at least one first vertically trimmed spacer is removed along a length of the mandrel on which the at least one first vertically trimmed spacer is disposed.

11. The semiconductor device of claim 3, wherein the mandrels comprise elongated features, wherein the first or second sidewall of at least one mandrel has no first vertically trimmed spacer or second vertically trimmed spacer disposed thereon.

12. The semiconductor device of claim 3, wherein the first width and the second width are less than 15 nm.

13. The semiconductor device of claim 3, wherein the first width and the second width are less than 10 nm.

14. The semiconductor device of claim 3, wherein the mandrels comprise a first material, wherein the first and second vertically trimmed spacers comprise a second material, wherein the first and second materials have an etch selectivity with respect to each other.

15. The semiconductor device of claim 1, wherein the first width and the second width are less than 15 nm.

16. The semiconductor device of claim 1, wherein the first width and the second width are less than 10 nm.

17. The semiconductor device of claim 2, wherein the first width and the second width are less than 15 nm.

18. The semiconductor device of claim 2, wherein the first width and the second width are less than 10 nm.

* * * * *